(12) United States Patent  
Stefanski et al.

(10) Patent No.: US 8,532,827 B2  
(45) Date of Patent: Sep. 10, 2013

(54) PROSPECTIVE DETERMINATION OF PROCESSOR WAKE-UP CONDITIONS IN ENERGY BUFFERED HVAC CONTROL UNIT

(71) Applicant: Nest Labs, Inc., Palo Alto, CA (US)

(72) Inventors: Mark D. Stefanski, Palo Alto, CA (US); Anthony Michael Fadell, Portola Valley, CA (US); Matthew Lee Rogers, Los Gatos, CA (US); Edwin H. Satterthwaite, Palo Alto, CA (US); Andrea Mucignat, San Francisco, CA (US); Joseph Adam Ruff, San Jose, CA (US); Hugo Fiennes, Palo Alto, CA (US)

(73) Assignee: Nest Labs, Inc., Palo Alto, CA (US)

( * ) Notice: Subject to any disclaimer, the term of this patent is extended or adjusted under 35 U.S.C. 154(b) by 0 days.

(21) Appl. No.: 13/632,137

(22) Filed: Sep. 30, 2012

(65) Prior Publication Data

US 2013/0103204 A1 Apr. 25, 2013

Related U.S. Application Data

(60) Provisional application No. 61/627,996, filed on Oct. 21, 2011.

(51) Int. Cl.
*G06F 19/00* (2011.01)
(52) U.S. Cl.
USPC .......................... 700/276; 236/91 R
(58) Field of Classification Search
USPC ................ 700/276, 17, 83, 82; 263/93, 91 R
See application file for complete search history.

(56) References Cited

U.S. PATENT DOCUMENTS

| 4,157,506 A | 6/1979 | Spencer |
| 4,223,831 A | 9/1980 | Szarka |
| 4,308,991 A | 1/1982 | Peinetti et al. |
| 4,335,847 A | 6/1982 | Levine |

(Continued)

FOREIGN PATENT DOCUMENTS

| CA | 2202008 C | 2/2000 |
| EP | 207295 A1 | 1/1987 |

(Continued)

OTHER PUBLICATIONS

Aprilaire Electronic Thermostats Model 8355 User's Manual, Research Products Corporation, 2000, 16 pages.

(Continued)

*Primary Examiner* — Kidest Bahta
(74) *Attorney, Agent, or Firm* — Kilpatrick Townsend & Stockton LLP

(57) ABSTRACT

A thermostat includes at least a housing, a user interface, a memory, an environmental sensor, and a processing system. The processing system may be configured to operate in a wake state and a sleep state by determining wake-up conditions upon which the processor is to enter into the wake state from the sleep state that includes a threshold value associated with an environmental condition sensed by the environmental sensor, causing the wake-up conditions to be stored in the memory, operating in the sleep state during a time interval subsequent to causing the wake-up conditions to be stored in the memory, determining whether at least one of the wake-up conditions has been met, and operating in the wake state upon a determination that the at least one wake-up condition has been met.

20 Claims, 13 Drawing Sheets

(56) References Cited

U.S. PATENT DOCUMENTS

| | | |
|---|---|---|
| 4,408,711 A | 10/1983 | Levine |
| 4,528,459 A | 7/1985 | Wiegel |
| 4,615,380 A | 10/1986 | Beckey |
| 4,669,654 A * | 6/1987 | Levine et al. ............... 236/46 R |
| 4,674,027 A | 6/1987 | Beckey |
| 4,685,614 A | 8/1987 | Levine |
| 4,695,246 A | 9/1987 | Beilfuss et al. |
| 4,751,961 A | 6/1988 | Levine et al. |
| 4,842,510 A | 6/1989 | Grunden et al. |
| 4,872,828 A | 10/1989 | Mierzwinski et al. |
| 4,898,229 A | 2/1990 | Brown et al. |
| 4,948,044 A | 8/1990 | Cacciatore |
| 4,955,806 A | 9/1990 | Grunden et al. |
| 5,088,645 A | 2/1992 | Bell |
| 5,107,918 A | 4/1992 | McFarlane et al. |
| 5,127,464 A | 7/1992 | Butler et al. |
| 5,158,477 A | 10/1992 | Testa et al. |
| 5,175,439 A | 12/1992 | Harer et al. |
| 5,211,332 A | 5/1993 | Adams |
| 5,240,178 A | 8/1993 | Dewolf et al. |
| 5,251,813 A | 10/1993 | Kniepkamp |
| 5,255,179 A | 10/1993 | Zekan et al. |
| 5,347,982 A | 9/1994 | Binzer et al. |
| 5,352,930 A | 10/1994 | Ratz |
| 5,381,950 A | 1/1995 | Aldridge |
| 5,395,042 A | 3/1995 | Riley et al. |
| 5,422,808 A | 6/1995 | Catanese, Jr. et al. |
| 5,452,762 A | 9/1995 | Zillner, Jr. |
| 5,456,407 A | 10/1995 | Stalsberg et al. |
| 5,460,327 A | 10/1995 | Hill et al. |
| 5,462,225 A | 10/1995 | Massara et al. |
| 5,467,921 A | 11/1995 | Shreeve et al. |
| 5,476,221 A | 12/1995 | Seymour |
| 5,499,196 A | 3/1996 | Pacheco |
| 5,506,569 A | 4/1996 | Rowlette |
| 5,555,927 A | 9/1996 | Shah |
| 5,570,837 A | 11/1996 | Brown et al. |
| 5,595,342 A | 1/1997 | McNair et al. |
| 5,611,484 A | 3/1997 | Uhrich |
| 5,635,896 A | 6/1997 | Tinsley et al. |
| 5,646,349 A | 7/1997 | Twigg et al. |
| 5,655,709 A | 8/1997 | Garnett et al. |
| 5,673,850 A * | 10/1997 | Uptegraph ................. 236/46 R |
| 5,697,552 A | 12/1997 | McHugh et al. |
| 5,736,795 A | 4/1998 | Zuehlke et al. |
| 5,902,183 A | 5/1999 | D'Souza |
| 5,903,139 A | 5/1999 | Kompelien |
| 5,909,378 A | 6/1999 | De Milleville |
| 5,977,964 A | 11/1999 | Williams et al. |
| 6,060,719 A | 5/2000 | DiTucci et al. |
| 6,062,482 A | 5/2000 | Gauthier et al. |
| 6,084,518 A | 7/2000 | Jamieson |
| 6,089,310 A | 7/2000 | Toth et al. |
| 6,098,893 A | 8/2000 | Berglund et al. |
| 6,213,404 B1 | 4/2001 | Dushane et al. |
| 6,216,956 B1 | 4/2001 | Ehlers et al. |
| 6,222,719 B1 | 4/2001 | Kadah |
| 6,275,160 B1 | 8/2001 | Ha |
| 6,315,211 B1 | 11/2001 | Sartain et al. |
| 6,349,883 B1 | 2/2002 | Simmons et al. |
| 6,356,038 B2 | 3/2002 | Bishel |
| 6,356,204 B1 | 3/2002 | Guindi et al. |
| 6,509,838 B1 | 1/2003 | Payne et al. |
| 6,513,723 B1 | 2/2003 | Mueller et al. |
| 6,566,768 B2 | 5/2003 | Zimmerman et al. |
| 6,622,925 B2 | 9/2003 | Carner et al. |
| 6,645,066 B2 | 11/2003 | Gutta et al. |
| 6,657,418 B2 | 12/2003 | Atherton |
| 6,743,010 B2 | 6/2004 | Bridgeman et al. |
| 6,769,482 B2 | 8/2004 | Wagner et al. |
| 6,794,771 B2 | 9/2004 | Orloff |
| 6,798,341 B1 | 9/2004 | Eckel et al. |
| 6,886,754 B2 | 5/2005 | Smith et al. |
| 6,956,463 B2 | 10/2005 | Crenella et al. |
| 7,024,336 B2 | 4/2006 | Salsbury et al. |
| 7,174,239 B2 | 2/2007 | Butler et al. |
| RE40,437 E | 7/2008 | Rosen |
| 7,469,550 B2 | 12/2008 | Chapman, Jr. et al. |
| 7,476,988 B2 | 1/2009 | Mulhouse et al. |
| 7,510,126 B2 | 3/2009 | Rossi et al. |
| 7,537,171 B2 | 5/2009 | Mueller et al. |
| 7,571,865 B2 | 8/2009 | Nicodem et al. |
| 7,644,869 B2 | 1/2010 | Hoglund et al. |
| 7,648,077 B2 | 1/2010 | Rossi et al. |
| 7,667,163 B2 * | 2/2010 | Ashworth et al. ............ 219/502 |
| 7,673,809 B2 | 3/2010 | Juntunen |
| 7,702,424 B2 | 4/2010 | Cannon et al. |
| 7,748,640 B2 | 7/2010 | Roher et al. |
| 7,755,220 B2 | 7/2010 | Sorg et al. |
| 7,775,452 B2 | 8/2010 | Shah et al. |
| 7,784,704 B2 | 8/2010 | Harter |
| 7,802,618 B2 | 9/2010 | Simon et al. |
| 7,841,542 B1 | 11/2010 | Rosen |
| 7,848,900 B2 | 12/2010 | Steinberg et al. |
| 7,854,389 B2 | 12/2010 | Ahmed |
| 7,900,849 B2 | 3/2011 | Barton et al. |
| 8,010,237 B2 | 8/2011 | Cheung et al. |
| 8,019,567 B2 | 9/2011 | Steinberg et al. |
| 8,090,477 B1 | 1/2012 | Steinberg |
| 8,131,497 B2 | 3/2012 | Steinberg et al. |
| 8,180,492 B2 | 5/2012 | Steinberg |
| 2002/0074865 A1 | 6/2002 | Zimmerman et al. |
| 2003/0064335 A1 | 4/2003 | Canon |
| 2003/0231001 A1 | 12/2003 | Bruning |
| 2004/0120084 A1 | 6/2004 | Readio et al. |
| 2004/0209209 A1 | 10/2004 | Chodacki et al. |
| 2004/0245349 A1 | 12/2004 | Smith |
| 2004/0249479 A1 | 12/2004 | Shorrock |
| 2005/0043907 A1 | 2/2005 | Eckel et al. |
| 2005/0128067 A1 | 6/2005 | Zakrewski |
| 2005/0189429 A1 | 9/2005 | Breeden |
| 2005/0270151 A1 | 12/2005 | Winick |
| 2005/0280421 A1 | 12/2005 | Yomoda et al. |
| 2006/0124759 A1 | 6/2006 | Rossi et al. |
| 2006/0186214 A1 | 8/2006 | Simon et al. |
| 2006/0196953 A1 | 9/2006 | Simon et al. |
| 2007/0045432 A1 | 3/2007 | Juntunen |
| 2007/0131787 A1 | 6/2007 | Rossi et al. |
| 2007/0228183 A1 | 10/2007 | Kennedy et al. |
| 2007/0241203 A1 | 10/2007 | Wagner et al. |
| 2007/0296280 A1 | 12/2007 | Sorg et al. |
| 2008/0015742 A1 | 1/2008 | Kulyk et al. |
| 2008/0054082 A1 | 3/2008 | Evans et al. |
| 2008/0094010 A1 | 4/2008 | Black |
| 2008/0147242 A1 | 6/2008 | Roher et al. |
| 2008/0191045 A1 | 8/2008 | Harter |
| 2008/0317292 A1 | 12/2008 | Baker et al. |
| 2009/0012959 A1 * | 1/2009 | Ylivainio et al. ................. 707/7 |
| 2009/0099697 A1 | 4/2009 | Li et al. |
| 2009/0140057 A1 | 6/2009 | Leen |
| 2009/0171862 A1 | 7/2009 | Harrod et al. |
| 2009/0194601 A1 | 8/2009 | Flohr |
| 2009/0236433 A1 | 9/2009 | Mueller et al. |
| 2009/0254225 A1 | 10/2009 | Boucher et al. |
| 2009/0259713 A1 | 10/2009 | Blumrich et al. |
| 2010/0006660 A1 | 1/2010 | Leen et al. |
| 2010/0019051 A1 | 1/2010 | Rosen |
| 2010/0025483 A1 | 2/2010 | Hoeynck et al. |
| 2010/0070084 A1 | 3/2010 | Steinberg et al. |
| 2010/0070086 A1 | 3/2010 | Harrod et al. |
| 2010/0070089 A1 * | 3/2010 | Harrod et al. ................. 700/277 |
| 2010/0070099 A1 | 3/2010 | Watson et al. |
| 2010/0070234 A1 | 3/2010 | Steinberg et al. |
| 2010/0084482 A1 | 4/2010 | Kennedy et al. |
| 2010/0182743 A1 | 7/2010 | Roher |
| 2010/0193592 A1 | 8/2010 | Simon et al. |
| 2010/0198425 A1 * | 8/2010 | Donovan ..................... 700/299 |
| 2010/0211224 A1 | 8/2010 | Keeling et al. |
| 2010/0262298 A1 | 10/2010 | Johnson et al. |
| 2010/0262299 A1 | 10/2010 | Cheung et al. |
| 2010/0280667 A1 | 11/2010 | Steinberg |
| 2010/0289643 A1 | 11/2010 | Trundle et al. |
| 2010/0308119 A1 | 12/2010 | Steinberg et al. |
| 2010/0318227 A1 | 12/2010 | Steinberg et al. |

| | | | |
|---|---|---|---|
| 2011/0025257 | A1 | 2/2011 | Weng |
| 2011/0046792 | A1 | 2/2011 | Imes et al. |
| 2011/0046805 | A1 | 2/2011 | Bedros et al. |
| 2011/0046806 | A1 | 2/2011 | Nagel et al. |
| 2011/0077896 | A1 | 3/2011 | Steinberg et al. |
| 2011/0185895 | A1 | 8/2011 | Freen |
| 2011/0253796 | A1 | 10/2011 | Posa et al. |
| 2011/0307103 | A1 | 12/2011 | Cheung et al. |
| 2012/0005590 | A1* | 1/2012 | Lombard et al. ............ 715/742 |
| 2012/0065935 | A1 | 3/2012 | Steinberg et al. |
| 2012/0085831 | A1 | 4/2012 | Kopp |
| 2012/0158350 | A1 | 6/2012 | Steinberg et al. |
| 2012/0221151 | A1 | 8/2012 | Steinberg |
| 2012/0248211 | A1 | 10/2012 | Warren et al. |

FOREIGN PATENT DOCUMENTS

| | | |
|---|---|---|
| EP | 196069 B1 | 12/1991 |
| EP | 510807 A2 | 10/1992 |
| EP | 660287 A1 | 6/1995 |
| EP | 690363 A2 | 1/1996 |
| EP | 2302326 A1 | 3/2011 |
| JP | 59106311 A | 6/1984 |
| JP | 01252850 A | 10/1989 |
| JP | 09298780 A | 11/1997 |
| WO | 2008054938 A2 | 5/2008 |

OTHER PUBLICATIONS

Braeburn 5300 Installer Guide, Braeburn Systems, LLC, 2009, 10 pages.
Braeburn Model 5200, Braeburn Systems, LLC, 2011, 11 pages.
Ecobee Smart Si Thermostat Installation Manual, Ecobee, 2012, 40 pages.
Ecobee Smart Si Thermostat User Manual, Ecobee, 2012, 44 pages.
Ecobee Smart Thermostat Installation Manual, 2011, 20 pages.
Ecobee Smart Thermostat User Manual, 2010, 20 pages.
Electric Heat Lock Out on Heat Pumps, Washington State University Extension Energy Program, Apr. 2010, pp. 1-3.
Honeywell Installation Guide FocusPRO TH6000 Series, Honeywell International, Inc., 2012, 24 pages.
Honeywell Operating Manual FocusPRO TH6000 Series, Honeywell International, Inc., 2011, 80 pages.
Honeywell Prestige IAQ Product Data 2, Honeywell International, Inc., 2012, 126 pages.
Honeywell Prestige THX9321 and TXH9421 Product Data, Honeywell International, Inc., 68-0311, No Date Given, 126 pages.
Honeywell Prestige THX9321-9421 Operating Manual, Honeywell International, Inc., 2011, 120 pages.
Hunter Internet Thermostat Installation Guide, Hunter Fan Co., 2012, 8 pages.
Introducing the New Smart Si Thermostat, Datasheet [online]. Ecobee, No Date Given [retrieved on Feb. 25, 2013]. Retrieved from the Internet: <URL: https://www.ecobee.com/solutions/home/smart-si/>.
Lennox ComfortSense 5000 Owners Guide, Lennox Industries, Inc., 2007, 32 pages.
Lennox ComfortSense 7000 Owners Guide, Lennox Industries, Inc., 2009, 15 pages.
Lennox iComfort Manual, Lennox Industries, Inc., 2010, 20 pages.
Lux PSPU732T Manual, LUX Products Corporation, No Date Given, 48 pages.
NetX RP32-WIFI Network Thermostat Consumer Brochure, Network Thermostat, No Date Given, 2 pages.
NetX RP32-WIFI Network Thermostat Specification Sheet, Network Thermostat, 2012, 2 pages.
RobertShaw Product Manual 9620, Maple Chase Company, 2001, 14 pages.
RobertShaw Product Manual 9825i2, Maple Chase Company, 2006, 36 pages.
SYSTXCCUIZ01-V Infinity Control Installation Instructions, Carrier Corp, 2012, 20 pages.
T8611G Chronotherm IV Deluxe Programmable Heat Pump Thermostat Product Data, Honeywell International Inc., 1997, 24 pages.
TB-PAC, TB-PHP, Base Series Programmable Thermostats, Carrier Corp, 2012, 8 pages.
The Perfect Climate Comfort Center PC8900A W8900A-C Product Data Sheet, Honeywell International Inc, 2001, 44 pages.
Trane Communicating Thermostats for Fan Coil, Trane, 2011, 32 pages.
Trane Communicating Thermostats for Heat Pump Control, Trane, 2011, 32 pages.
Trane Install XL600 Installation Manual, Trane, 2006, 16 pages.
Trane XL950 Installation Guide, Trane, 2011, 20 pages.
Venstar T2900 Manual, Venstar, Inc., 2008, 113 pages.
Venstar T5800 Manual, Venstar, Inc., No Date Given, 63 pages.
VisionPRO TH8000 Series Installation Guide, Honeywell International, Inc., 2012, 12 pages.
VisionPRO TH8000 Series Operating Manual, Honeywell International, Inc., 2012, 96 pages.
VisionPRO Wi-Fi Programmable Thermostat, Honeywell International, Inc. Operating Manual, 2012, 48 pages.
White Rodgers (Emerson) Model 1F81-261 Installation and Operating Instructions, White Rodgers, No Date Given, 63 pages.
White Rodgers (Emerson) Model IF98EZ-1621 Homeowner's User Guide, White Rodgers, No Date Given, 28 pages.
Allen et al., "Real-Time Earthquake Detection and Hazard Assessment by ElarmS Across California", Geophysical Research Letters, vol. 36, L00B08, 2009, pp. 1-6.
Deleeuw, "Ecobee WiFi Enabled Smart Thermostat Part 2: The Features Review", Retrieved from <URL: http://www.homenetworkenabled.com/content.php?136-ecobee-WiFi-enabled-Smart-Thermostat-Part-2-The-Features-review>, Dec. 2, 2011, 5 pages.
Gao et al., "The Self-Programming Thermostat: Optimizing Setback Schedules Based on Home Occupancy Patterns", In Proceedings of the First ACM Workshop on Embedded Sensing Systems for Energy-Efficiency in Buildings, Nov. 3, 2009, 6 pages.
Loisos et al., "Buildings End-Use Energy Efficiency: Alternatives to Compressor Cooling", California Energy Commision, Public Interest Energy Research, Jan. 2000, 80 pages.
Lu et al., "The Smart Thermostat: Using Occupancy Sensors to Save Energy in Homes", In Proceedings of the 8th ACM Conference on Embedded Networked Sensor Systems, Nov. 3-5, 2010, pp. 211-224.
Mozer, "The Neural Network House: An Environmental that Adapts to it's Inhabitants", AAAI Technical Report SS-98-02, 1998, pp. 110-114.

* cited by examiner

PROSPECTIVE DETERMINATION OF PROCESSOR WAKE-UP CONDITIONS IN ENERGY BUFFERED HVAC CONTROL UNIT

CROSS-REFERENCES TO RELATED APPLICATIONS

This application claims the benefit of the following commonly assigned application, which is incorporated by reference herein: U.S. Provisional Application No. 61/627,996 filed Oct. 21, 2011.

TECHNICAL FIELD

This patent specification relates to systems and methods for the monitoring and control of energy-consuming systems or other resource-consuming systems. More particularly, this patent specification relates to control units that govern the operation of energy-consuming systems, household devices, or other resource-consuming systems, including methods for activating electronic displays for thermostats that govern the operation of heating, ventilation, and air conditioning (HVAC) systems.

BACKGROUND OF THE INVENTION

Substantial effort and attention continue toward the development of newer and more sustainable energy supplies. The conservation of energy by increased energy efficiency remains crucial to the world's energy future. According to an October 2010 report from the U.S. Department of Energy, heating and cooling account for 56% of the energy use in a typical U.S. home, making it the largest energy expense for most homes. Along with improvements in the physical plant associated with home heating and cooling (e.g., improved insulation, higher efficiency furnaces), substantial increases in energy efficiency can be achieved by better control and regulation of home heating and cooling equipment.

As discussed in the technical publication No. 50-8433, entitled "Power Stealing Thermostats" from Honeywell (1997), early thermostats used a bimetallic strip to sense temperature and respond to temperature changes in the room. The movement of the bimetallic strip was used to directly open and close an electrical circuit. Power was delivered to an electromechanical actuator, usually relay or contactor in the HVAC equipment whenever the contact was closed to provide heating and/or cooling to the controlled space. Since these thermostats did not require electrical power to operate, the wiring connections were very simple. Only one wire connected to the transformer and another wire connected to the load. Typically, a 24 VAC power supply transformer, the thermostat, and 24 VAC HVAC equipment relay were all connected in a loop with each device having only two required external connections.

When electronics began to be used in thermostats, the fact that the thermostat was not directly wired to both sides of the transformer for its power source created a problem. This meant that the thermostat had to be hardwired directly from the system transformer. Direct hardwiring a common "C" wire from the transformer to the electronic thermostat may be very difficult and costly.

Because many households do not have a direct wire from the system transformer (such as a "C" wire), some thermostats have been designed to derive power from the transformer through the equipment load. The methods for powering an electronic thermostat from the transformer with a single direct wire connection to the transformer are called "power stealing" or "power sharing" methods. The thermostat "steals," "shares," or "harvests" its power during the "OFF" periods of the heating or cooling system by allowing a small amount of current to flow through it into the load coil below the load coil's response threshold (even at maximum transformer output voltage). During the "ON" periods of the heating or cooling system the thermostat draws power by allowing a small voltage drop across itself. Ideally, the voltage drop will not cause the load coil to dropout below its response threshold (even at minimum transformer output voltage). Examples of thermostats with power stealing capability include the Honeywell T8600, Honeywell T8400C, and the Emerson Model 1F97-0671. However, these systems do not have power storage means and therefore must always rely on power stealing.

Additionally, microprocessor controlled "intelligent" thermostats may have more advanced environmental control capabilities that can save energy while also keeping occupants comfortable. To do this, these thermostats require more information from the occupants as well as the environments where the thermostats are located. These thermostats may also be capable of connection to computer networks, including both local area networks (or other "private" networks) and wide area networks such as the Internet (or other "public" networks), in order to obtain current and forecasted outside weather data, cooperate in so-called demand-response programs (e.g., automatic conformance with power alerts that may be issued by utility companies during periods of extreme weather), enable users to have remote access and/or control thereof through their network-connected device (e.g., smartphone, tablet computer, PC-based web browser), and other advanced functionalities that may require network connectivity.

Issues arise in relation to providing microprocessor-controlled thermostats using high-powered user interfaces, one or more such issues being at least partially resolved by one or more of the embodiments described herein below. On the one hand, it is desirable to provide a thermostat having advanced functionalities such as those associated with relatively powerful microprocessors and reliable wireless communications chips, while also providing a thermostat that has an attractive, visually pleasing electronic display that users will find appealing to view and interact with. On the other hand, it is desirable to provide a thermostat that is compatible and adaptable for installation in a wide variety of homes, including a substantial percentage of homes that are not equipped with the "C" wire discussed above. It is still further desirable to provide such a thermostat that accommodates easy do-it-yourself installation such that the expense and inconvenience of arranging for an HVAC technician to visit the premises to install the thermostat can be avoided for a large number of users. It is still further desirable to provide a thermostat having such processing power, wireless communications capabilities, visually pleasing display qualities, and other advanced functionalities, while also being a thermostat that, in addition to not requiring a "C" wire, likewise does not need to be plugged into a household line current or a so-called "power brick," which can be inconvenient for the particular location of the thermostat as well as unsightly. Therefore, improvements are needed in the art.

BRIEF SUMMARY OF THE INVENTION

In one embodiment, a thermostat may be presented. The thermostat may include a housing, a user interface coupled to the housing, a memory disposed within the housing, one or more sensing systems configured to sense at least one environmental condition, and a processing system disposed within the housing and coupled to the user interface. In one embodiment, the processing system may be configured to be in operative communication with the one or more sensing systems, in operative communication with one or more input devices including the user interface for determining a setpoint temperature value, and in still further operative communication with a heating, ventilation, and air conditioning (HVAC) system to control the HVAC system based at least in part on a comparison of a measured ambient temperature and the setpoint temperature value. In one embodiment, the processing system may include a processor coupled to the memory, the processor having a relatively low power-consuming sleep state and a relatively high power-consuming wake state. The processing system may operate by determining a set of wake-up conditions upon which the processor is to enter into the wake state from the sleep state, the set of wake-up conditions including at least one threshold value associated with at least one of the environmental conditions sensed by the at least one sensing system. The processing system may also operate by causing the set of wake-up conditions to be stored in the memory and operating in a first mode in which the processor is in the sleep state during a time interval subsequent to the causing the set of wake-up conditions to be stored in the memory. The processing system may further operate by determining, while the processor is in the sleep state, whether at least one of the set of wake-up conditions including the at least one threshold value has been met, and operating in a second mode in which the processor is in the wake state upon a determination that the at least one of the set of wake-up conditions has been met, the processing system being configured to control the HVAC system while operating in the second operating mode.

In another embodiment, a method of reducing an amount of power used by a thermostat may be provided. The thermostat may include a housing and a user interface coupled to the housing. The method may include providing power to a processing system disposed within the housing and coupled to the user interface. In one embodiment, the processing system being configured to be in operative communication with one or more sensing systems configured to sense at least one environmental condition, in operative communication with one or more input devices including the user interface for determining a setpoint temperature value, and in still further operative communication with a heating, ventilation, and air conditioning (HVAC) system to control the HVAC system based at least in part on a comparison of a measured ambient temperature and the setpoint temperature value, the processing system including a processor coupled to a memory. In one embodiment, the processor may have a relatively low power-consuming sleep state and a relatively high power-consuming wake state. The method may also include determining a set of wake-up conditions upon which the processor is to enter into the wake state from the sleep state, the set of wake-up conditions including at least one threshold value associated with at least one of the environmental conditions sensed by the at least one sensing system. The method may additionally include causing the set of wake-up conditions to be stored in the memory and operating in a first mode in which the processor is in the sleep state during a time interval subsequent to the causing the set of wake-up conditions to be stored in the memory. The method may further include determining, while the processor is in the sleep state, whether at least one of the set of wake-up conditions including the at least one threshold value has been met, and operating in a second mode in which the processor is in the wake state upon a determination that the at least one of the set of wake-up conditions has been met, the processing system being configured to control the HVAC system while operating in the second operating mode.

In yet another embodiment, a thermostat may be provided. The thermostat may include a housing comprising a user interface, a memory disposed within the housing, a temperature sensor disposed within the housing and configured to sense an ambient temperature, and a processing system disposed within the housing. The processing system comprises a first processor and a second processor. The first processor may be configured to determine a wake-up temperature threshold for determining when the first processor should transition from a low-power state to a high-power state, send the wake-up temperature threshold to the second processor, and transition from the high-power state to the low-power state after the wake-up temperature threshold is sent to the second processor. The second processor may be configured to receive a measurement of the ambient temperature from the temperature sensor, determine whether the ambient temperature violates the wake-up temperature threshold, and cause the first processor to transition from the low-power state to the high-power state if the ambient temperature violates the wake-up temperature threshold.

A further understanding of the nature and advantages of the present invention may be realized by reference to the remaining portions of the specification and the drawings. Also note that other embodiments may be described in the following disclosure and claims.

DETAILED DESCRIPTION OF THE INVENTION

Figure 1:
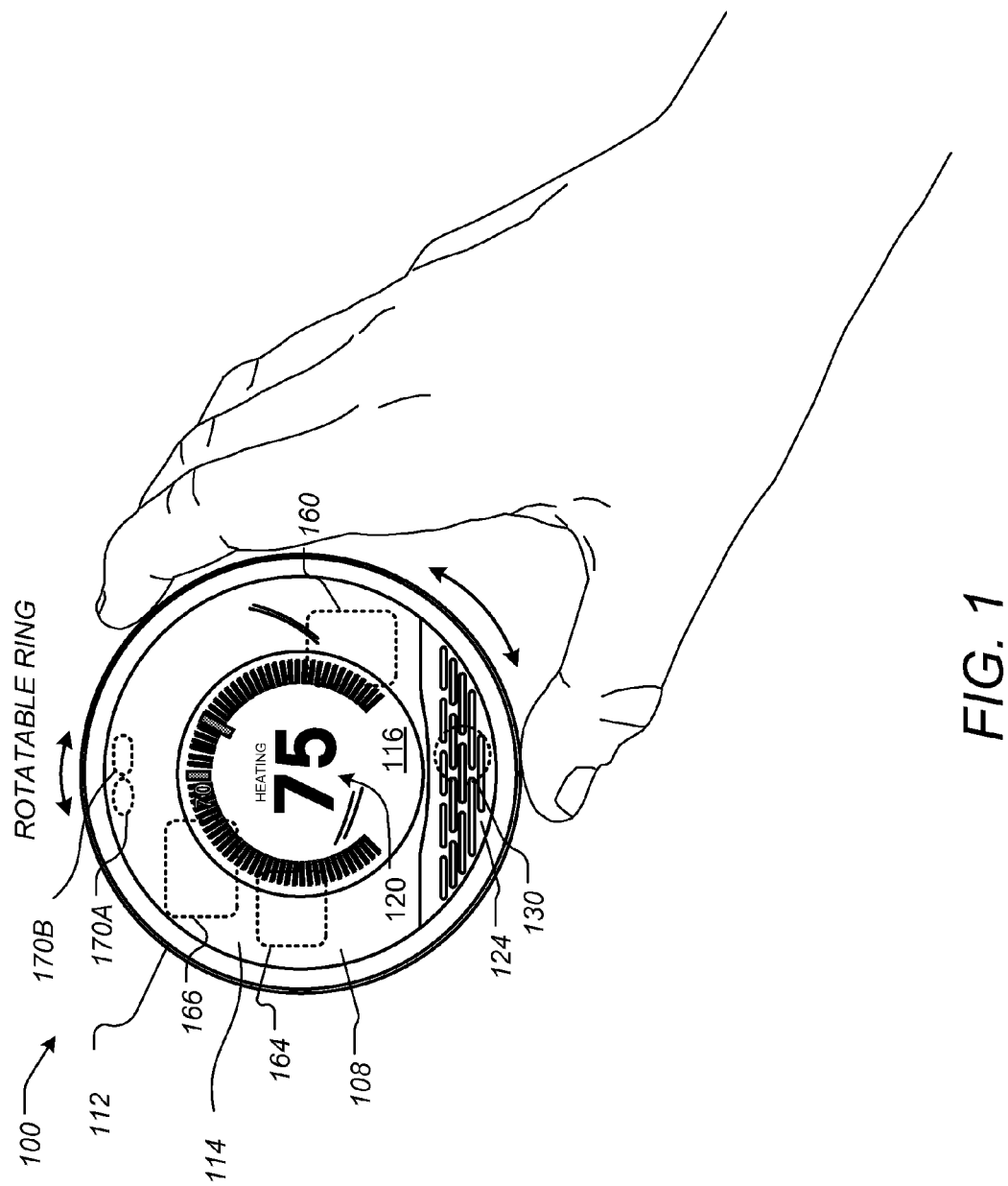
FIG. 1 illustrates a perspective view of a thermostat, according to one embodiment.

The subject matter of this patent specification relates to the subject matter of the following commonly assigned applications, each of which is incorporated by reference herein: U.S. Prov. Ser. No. 61/415,771 filed Nov. 19, 2010; U.S. Ser. No. 13/034,678 filed Feb. 24, 2011; International Application No. PCT/US12/00007 filed Jan. 3, 2012; and U.S. Ser. No. 13/467,025 filed May 8, 2012. The above-referenced patent applications are collectively referenced herein as "the commonly-assigned incorporated applications."

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

It is to be appreciated that while one or more embodiments are described further herein in the context of typical HVAC system used in a residential home, such as single-family residential home, the scope of the present teachings is not so limited. More generally, thermostats according to one or more of the preferred embodiments are applicable for a wide variety of enclosures having one or more HVAC systems including, without limitation, duplexes, townhomes, multi-unit apartment buildings, hotels, retail stores, office buildings, and industrial buildings. Further, it is to be appreciated that while the terms user, customer, installer, homeowner, occupant, guest, tenant, landlord, repair person, and/or the like may be used to refer to the person or persons who are interacting with the thermostat or other device or user interface in the context of one or more scenarios described herein, these references are by no means to be considered as limiting the scope of the present teachings with respect to the person or persons who are performing such actions.

Exemplary Thermostat Embodiments

Provided according to one or more embodiments are systems, methods, and computer program products for controlling one or more HVAC systems based on one or more versatile sensing and control units (VSCU units), each VSCU unit being configured and adapted to provide sophisticated, customized, energy-saving HVAC control functionality while at the same time being visually appealing, non-intimidating, and easy to use. The term "thermostat" is used herein below to represent a particular type of VSCU unit (Versatile Sensing and Control) that is particularly applicable for HVAC control in an enclosure. Although "thermostat" and "VSCU unit" may be seen as generally interchangeable for the contexts of HVAC control of an enclosure, it is within the scope of the present teachings for each of the embodiments herein to be applied to VSCU units having control functionality over measurable characteristics other than temperature (e.g., pressure, flow rate, height, position, velocity, acceleration, capacity, power, loudness, brightness) for any of a variety of different control systems involving the governance of one or more measurable characteristics of one or more physical systems, and/or the governance of other energy or resource consuming systems such as water usage systems, air usage systems, systems involving the usage of other natural resources, and systems involving the usage of various other forms of energy.

FIGS. 1-5 and the descriptions in relation thereto provide exemplary embodiments of thermostat hardware and/or software that can be used to implement the specific embodiments of the appended claims. This thermostat hardware and/or software is not meant to be limiting, and is presented to provide an enabling disclosure. FIG. 1 illustrates a perspective view of a thermostat 100, according to one embodiment. In this specific embodiment, the thermostat 100 can be controlled by at least two types of user input, the first being a rotation of the outer ring 112, and the second being an inward push on an outer cap 108 until an audible and/or tactile "click" occurs. As used herein, these two types of user inputs, may be referred to as "manipulating" the thermostat. In other embodiments, manipulating the thermostat may also include pressing keys on a keypad, voice recognition commands, and/or any other type of input that can be used to change or adjust settings on the thermostat 100.

For this embodiment, the outer cap 108 can comprise an assembly that includes the outer ring 112, a cover 114, an electronic display 116, and a metallic portion 124. Each of these elements, or the combination of these elements, may be referred to as a "housing" for the thermostat 100. Simultaneously, each of these elements, or the combination of these elements, may also form a user interface. The user interface may specifically include the electronic display 116. In FIG. 1, the user interface 116 may be said to operate in an active display mode. The active display mode may include providing a backlight for the electronic display 116. In other embodiments, the active display mode may increase the intensity and/or light output of the electronic display 116 such that a user can easily see displayed settings of the thermostat 100, such as a current temperature, a setpoint temperature, an HVAC function, and/or the like. The active display mode may be contrasted with an inactive display mode (not shown). The inactive display mode can disable a backlight, reduce the amount of information displayed, lessen the intensity of the display, and/or altogether turn off the electronic display 116, depending on the embodiment.

Depending on the settings of the thermostat 100, the active display mode and the inactive display mode of the electronic display 116 may also or instead be characterized by the relative power usage of each mode. In one embodiment, the active display mode may generally require substantially more electrical power than the inactive display mode. In some embodiments, different operating modes of the electronic display 116 may instead be characterized completely by their power usage. In these embodiments, the different operating modes of the electronic display 116 may be referred to as a first mode and a second mode, where the user interface requires more power when operating in the first mode than when operating in the second mode.

According to some embodiments the electronic display 116 may comprise a dot-matrix layout (individually addressable) such that arbitrary shapes can be generated, rather than being a segmented layout. According to some embodiments, a combination of dot-matrix layout and segmented layout is employed. According to some embodiments, electronic display 116 may be a backlit color liquid crystal display (LCD). An example of information displayed on the electronic display 116 is illustrated in FIG. 1, and includes central numerals 120 that are representative of a current setpoint temperature. According to some embodiments, metallic portion 124 can have a number of slot-like openings so as to facilitate the use of a sensors 130, such as a passive infrared motion sensor (PIR), mounted beneath the slot-like openings.

According to some embodiments, the thermostat 100 can include additional components, such as a processing system 160, display driver 164, and a wireless communications system 166. The processing system 160 can adapted or configured to cause the display driver 164 to cause the electronic display 116 to display information to the user. The processing system 160 can also be configured to receive user input via the rotatable ring 112. These additional components, including the processing system 160, can be enclosed within the housing, as displayed in FIG. 1. These additional components are described in further detail herein below.

The processing system 160, according to some embodiments, is capable of carrying out the governance of the thermostat's operation. For example, processing system 160 can be further programmed and/or configured to maintain and update a thermodynamic model for the enclosure in which the HVAC system is installed. According to some embodiments, the wireless communications system 166 can be used to communicate with devices such as personal computers, remote servers, handheld devices, smart phones, and/or other thermostats or HVAC system components. These communications can be peer-to-peer communications, communications through one or more servers located on a private network, or and/or communications through a cloud-based service.

Motion sensing as well as other techniques can be use used in the detection and/or prediction of occupancy, as is described further in the commonly assigned U.S. Ser. No. 12/881,430, supra. According to some embodiments, occupancy information can be a used in generating an effective and efficient scheduled program. For example, an active proximity sensor 170A can be provided to detect an approaching user by infrared light reflection, and an ambient light sensor 170B can be provided to sense visible light. The proximity sensor 170A can be used in conjunction with a plurality of other sensors to detect proximity in the range of about one meter so that the thermostat 100 can initiate "waking up" when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place or about to take place. The various types of sensors that may be used, as well as the operation of the "wake-up" function are described in much greater detail throughout the remainder of this disclosure.

Figure 2:
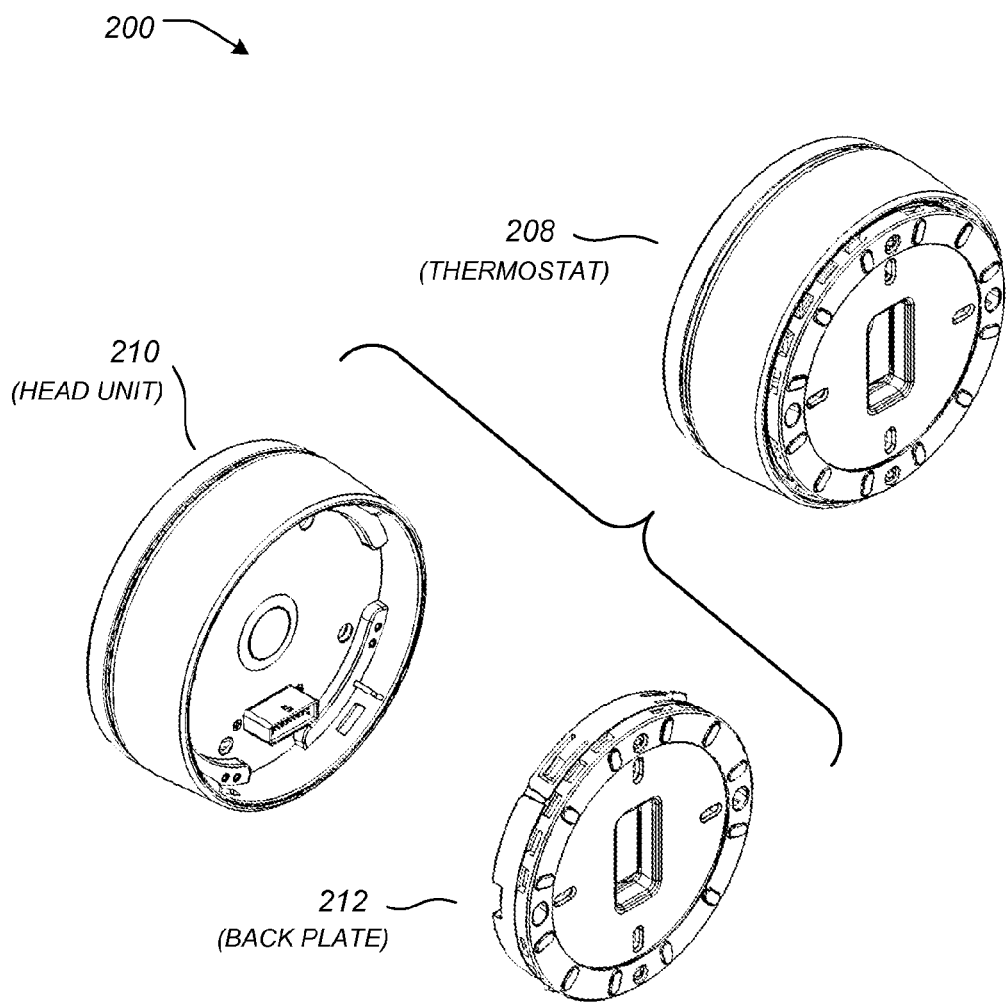
FIG. 2 illustrates an exploded perspective view of a thermostat having a head unit and the backplate, according to one embodiment.

In some embodiments, the thermostat can be physically and/or functionally divided into at least two different units. Throughout this disclosure, these two units can be referred to as a head unit and a backplate. FIG. 2 illustrates an exploded perspective view 200 of a thermostat 208 having a head unit 210 and a backplate 212, according to one embodiment. Physically, this arrangement may be advantageous during an installation process. In this embodiment, the backplate 212 can first be attached to a wall, and the HVAC wires can be attached to a plurality of HVAC connectors on the backplate 212. Next, the head unit 210 can be connected to the backplate 212 in order to complete the installation of the thermostat 208.

Figure 3A:
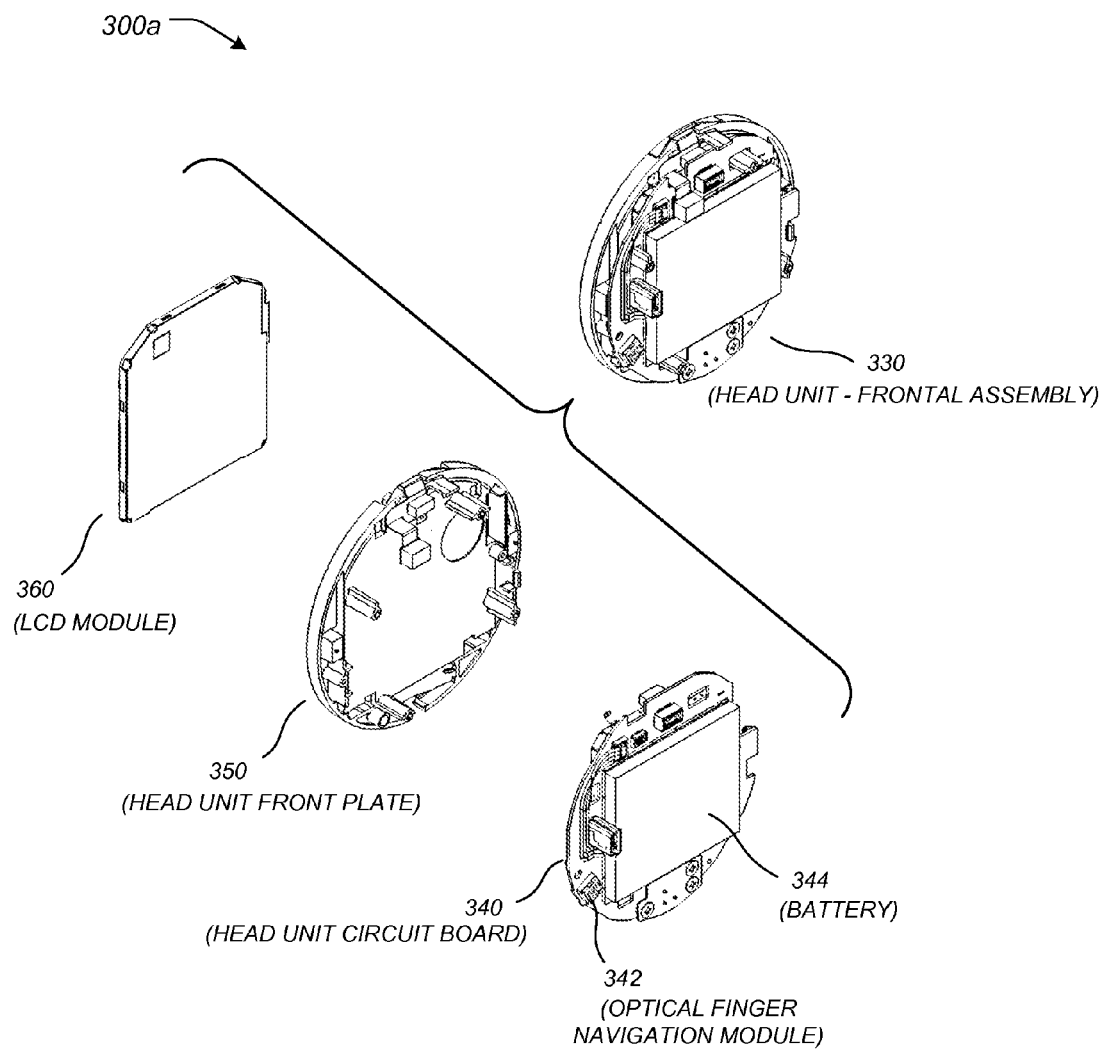
FIG. 3A illustrates an exploded perspective view of a head unit with respect to its primary components, according to one embodiment.

FIG. 3A illustrates an exploded perspective view 300a of a head unit 330 with respect to its primary components, according to one embodiment. Here, the head unit 330 may include an electronic display 360. According to this embodiment, the electronic display 360 may comprise an LCD module. Furthermore, the head unit 330 may include a mounting assembly 350 used to secure the primary components in a completely assembled head unit 330. The head unit 330 may further include a circuit board 340 that can be used to integrate various electronic components described further below. In this particular embodiment, the circuit board 340 of the head unit 330 can include a manipulation sensor 342 to detect user manipulations of the thermostat. In embodiments using a rotatable ring, the manipulation sensor 342 may comprise an optical finger navigation module as illustrated in FIG. 3A. A rechargeable battery 344 may also be included in the assembly of the head unit 330. In one preferred embodiment, rechargeable battery 344 can be a Lithium-Ion battery, which may have a nominal voltage of 3.7 volts and a nominal capacity of 560 mAh.

Figure 3B:
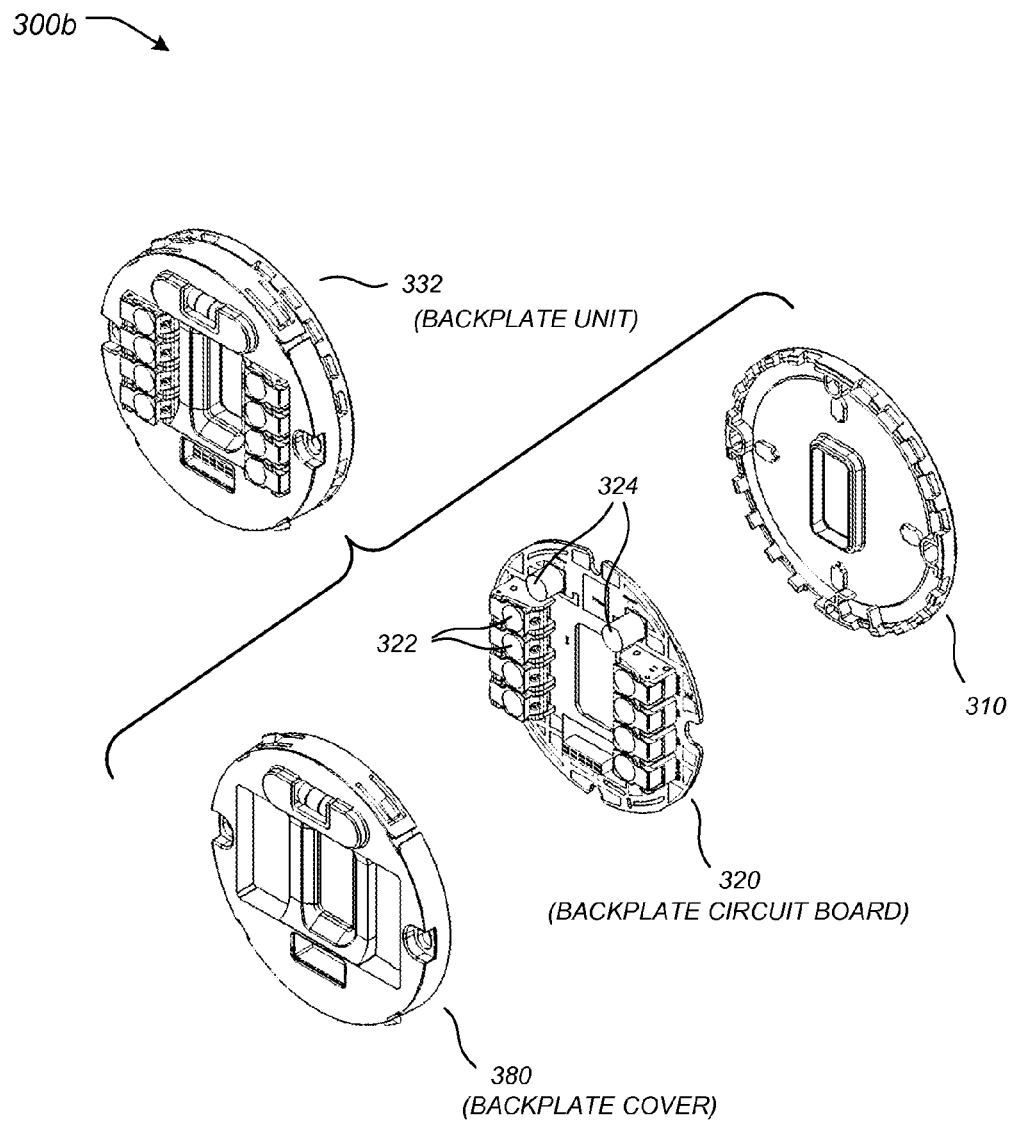
FIG. 3B illustrates an exploded perspective view of a backplate with respect to its primary components, according to one embodiment.

FIG. 3B illustrates an exploded perspective view 300b of a backplate 332 with respect to its primary components, according to one embodiment. The backplate 332 may include a frame 310 that can be used to mount, protect, or house a backplate circuit board 320. The backplate circuit board 320 may be used to mount electronic components, including one or more processing functions, and/or one or more HVAC wire connectors 322. The one or more HVAC wire connectors 322 may include integrated wire insertion sensing circuitry configured to determine whether or not a wire is mechanically and/or electrically connected to each of the one or more HVAC wire connectors 322. In this particular embodiment, two relatively large capacitors 324 are a part of power stealing circuitry that can be mounted to the backplate circuit board 320. The power stealing circuitry is discussed further herein below.

Figure 4A:
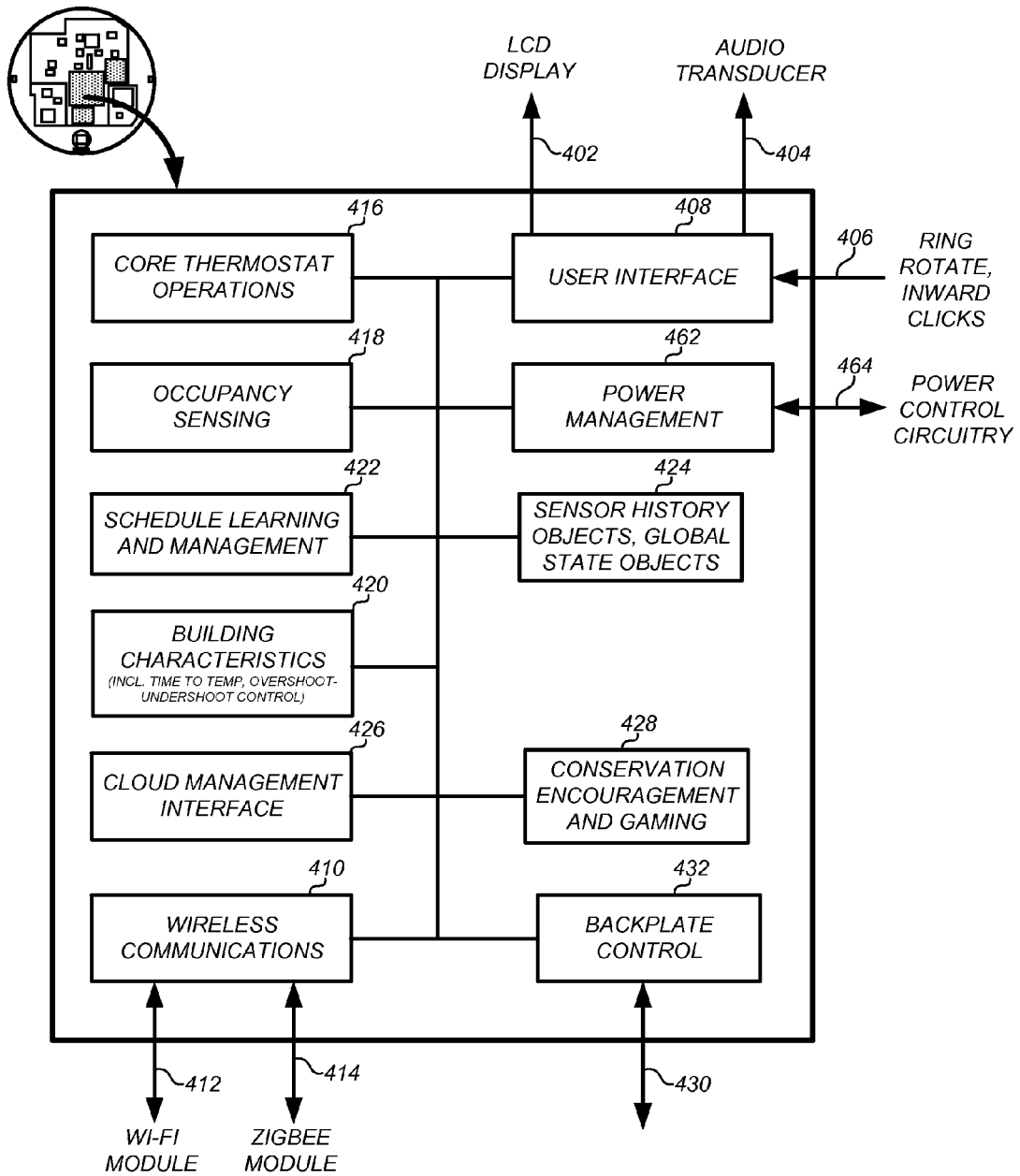
FIG. 4A illustrates a simplified functional block diagram for a head unit, according to one embodiment.

In addition to physical divisions within the thermostat that simplify installation process, the thermostat may also be divided functionally between the head unit and the backplate. FIG. 4A illustrates a simplified functional block diagram 400a for a head unit, according to one embodiment. The functions embodied by block diagram 400a are largely self-explanatory, and may be implemented using one or more processing functions. As used herein, the term "processing function" may refer to any combination of hardware and/or software. For example, a processing function may include a microprocessor, a microcontroller, distributed processors, a lookup table, digital logic, logical/arithmetic functions implemented in analog circuitry, and/or the like. A processing function may also be referred to as a processing system, a processing circuit, or simply a circuit.

In this embodiment, a processing function on the head unit may be implemented by an ARM processor. The head unit processing function may interface with the electronic display 402, an audio system 404, and a manipulation sensor 406 as a part of a user interface 408. The head unit processing function may also facilitate wireless communications 410 by interfacing with various wireless modules, such as a Wi-Fi module 412 and/or a ZigBee module 414. Furthermore, the head unit processing function may be configured to control the core thermostat operations 416, such as operating the HVAC system. The head unit processing function may further be configured to determine or sense occupancy 418 of a physical location, and to determine building characteristics 420 that can be used to determine time-to-temperature characteristics. Using the occupancy sensing 418, the processing function on the head unit may also be configured to learn and manage operational schedules 422, such as diurnal heat and cooling schedules. A power management module 462 may be used to interface with a corresponding power management module on the backplate, the rechargeable battery, and a power control circuit 464 on the backplate.

Additionally, the head unit processing function may include and/or be communicatively coupled to one or more memories. The one or more memories may include one or more sets of instructions that cause the processing function to operate as described above. The one or more memories may also include a sensor history and global state objects 424. The one or more memories may be integrated with the processing function, such as a flash memory or RAM memory available on many commercial microprocessors. The head unit processing function may also be configured to interface with a cloud management system 426, and may also operate to conserve energy wherever appropriate 428. An interface 432 to a backplate processing function 430 may also be included, and may be implemented using a hardware connector.

Figure 4B:
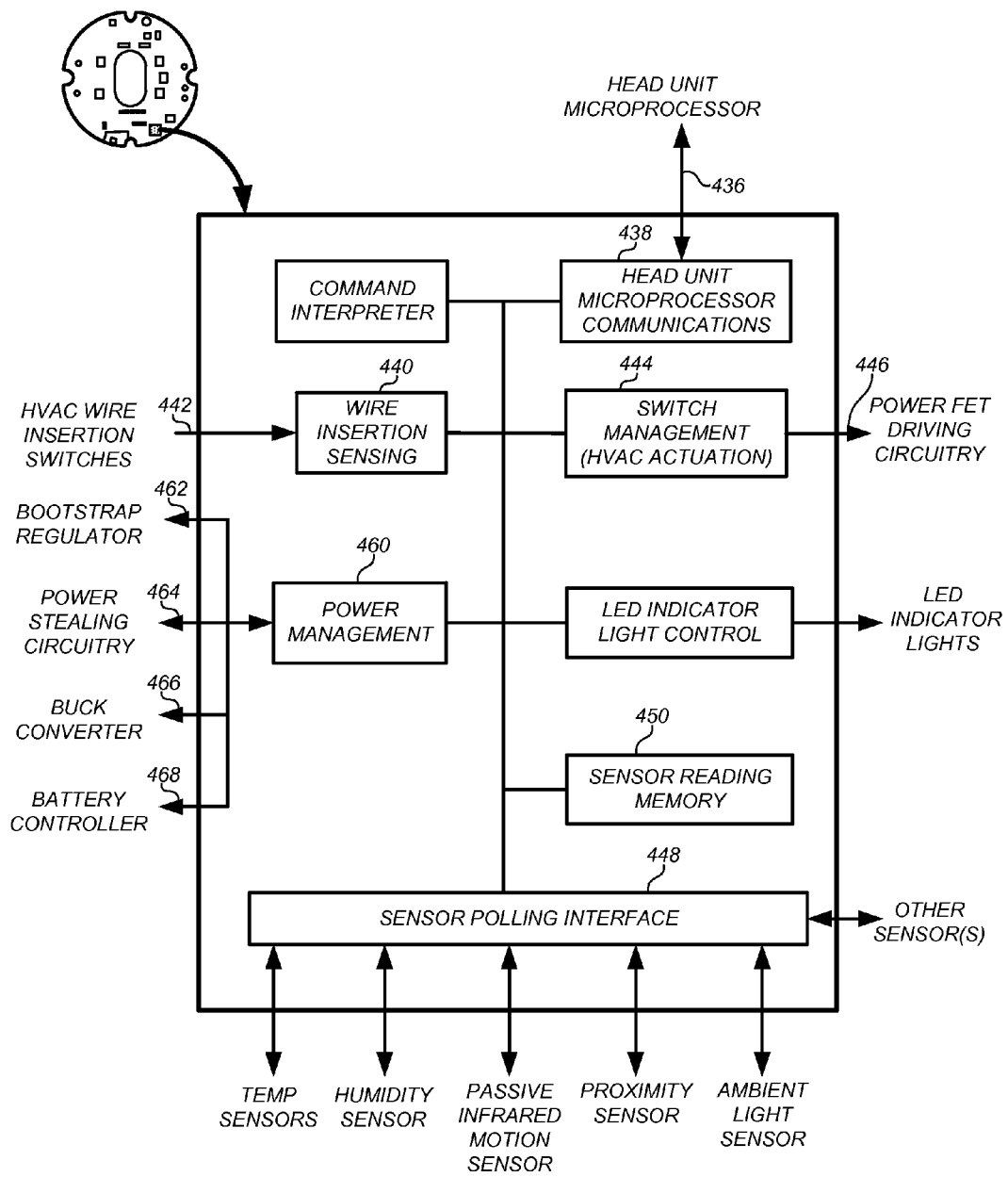
FIG. 4B illustrates a simplified functional block diagram for a backplate, according to one embodiment.

FIG. 4B illustrates a simplified functional block diagram for a backplate, according to one embodiment. Using an interface 436 that is matched to the interface 432 shown in FIG. 4A, the backplate processing function can communicate with the head unit processing function 438. The backplate processing function can include wire insertion sensing 440 that is coupled to external circuitry 442 configured to provide signals based on different wire connection states. The backplate processing function may be configured to manage the HVAC switch actuation 444 by driving power FET circuitry 446 to control the HVAC system.

The backplate processing function may also include a sensor polling interface 448 to interface with a plurality of sensors. In this particular embodiment, the plurality of sensors may include a temperature sensor, a humidity sensor, a PIR sensor, a proximity sensor, an ambient light sensor, and or other sensors not specifically listed. This list is not meant to be exhaustive. Other types of sensors may be used depending on the particular embodiment and application, such as sound sensors, flame sensors, smoke detectors, and/or the like. The sensor polling interface 448 may be communicatively coupled to a sensor reading memory 450. The sensor reading memory 450 can store sensor readings and may be located internally or externally to a microcontroller or microprocessor.

Finally, the backplate processing function can include a power management unit 460 that is used to control various digital and/or analog components integrated with the backplate and used to manage the power system of the thermostat. Although one having skill in the art will recognize many different implementations of a power management system, the power management system of this particular embodiment can include a bootstrap regulator 462, a power stealing circuit 464, a buck converter 466, and/or a battery controller 468.

Figure 5:
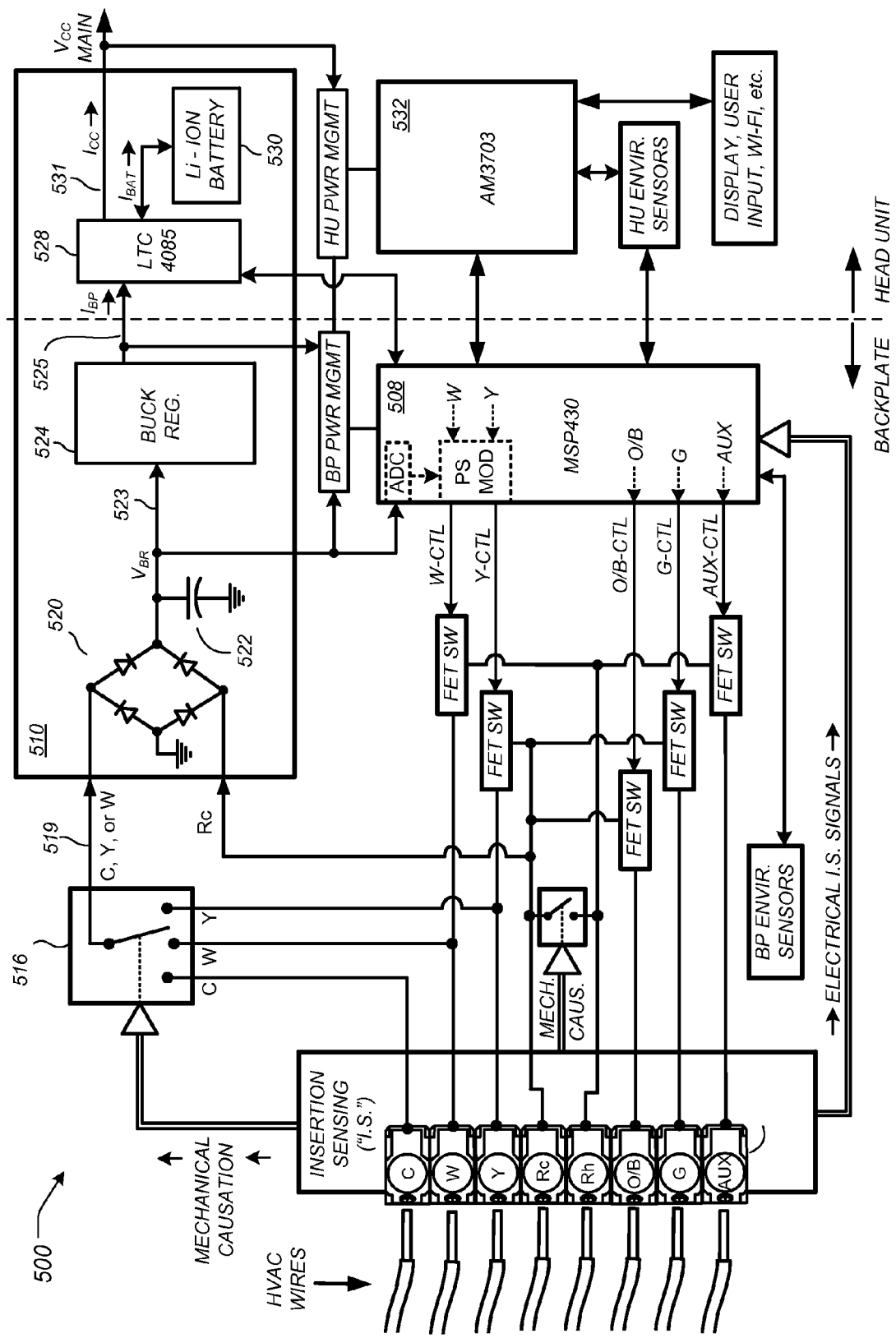
FIG. 5 illustrates a simplified circuit diagram of a system for managing the power consumed by a thermostat, according to one embodiment.

FIG. 5 illustrates a simplified circuit diagram 500 of a system for managing the power consumed by a thermostat, according to one embodiment. The powering circuitry 510 comprises a full-wave bridge rectifier 520, a storage and waveform-smoothing bridge output capacitor 522 (which can be, for example, on the order of 30 microfarads), a buck regulator circuit 524, a power-and-battery (PAB) regulation circuit 528, and a rechargeable lithium-ion battery 530. In conjunction with other control circuitry including backplate power management circuitry 527, head unit power management circuitry 529, and the microcontroller 508, the powering circuitry 510 can be configured and adapted to have the characteristics and functionality described herein below. Description of further details of the powering circuitry 510 and associated components can be found elsewhere in the instant disclosure and/or in the commonly assigned U.S. Ser. No. 13/034,678, supra, and U.S. Ser. No. 13/267,871, supra.

By virtue of the configuration illustrated in FIG. 5, when there is a "C" wire presented upon installation, the powering circuitry 510 operates as a relatively high-powered, rechargeable-battery-assisted AC-to-DC converting power supply. When there is not a "C" wire presented, the powering circuitry 510 operates as a power-stealing, rechargeable-battery-assisted AC-to-DC converting power supply. The powering circuitry 510 generally serves to provide the voltage Vcc MAIN that is used by the various electrical components of the thermostat, which in one embodiment can be about 4.0 volts. For the case in which the "C" wire is present, there is no need to worry about accidentally tripping (as there is in inactive power stealing) or untripping (for active power stealing) an HVAC call relay, and therefore relatively large amounts of power can be assumed to be available. Generally, the power supplied by the "C" wire will be greater than the instantaneous power required at any time by the remaining circuits in the thermostat.

However, a "C" wire will typically only be present in about 20% of homes. Therefore, the powering circuitry 510 may also be configured to "steal" power from one of the other HVAC wires in the absence of a "C" wire. As used herein, "inactive power stealing" refers to the power stealing that is performed during periods in which there is no active call in place based on the lead from which power is being stolen. Thus, for cases where it is the "Y" lead from which power is stolen, "inactive power stealing" refers to the power stealing that is performed when there is no active cooling call in place. As used herein, "active power stealing" refers to the power stealing that is performed during periods in which there is an active call in place based on the lead from which power is being stolen. Thus, for cases where it is the "Y" lead from which power is stolen, "active power stealing" refers to the power stealing that is performed when there is an active cooling call in place. During inactive or active power stealing, power can be stolen from a selected one of the available call relay wires. While a complete description of the power stealing circuitry 510 can be found in the commonly assigned applications that have been previously incorporated herein by reference, the following brief explanation is sufficient for purposes of this disclosure.

Some components in the thermostat, such as the head unit processing function, the user interface, and/or the electronic display may consume more instantaneous power than can be provided by power stealing alone. When these more power-hungry components are actively operating, the power supplied by power stealing can be supplemented with the rechargeable battery 530. In other words, when the thermostat is engaged in operations, such as when the electronic display is in an active display mode, power may be supplied by both power stealing and the rechargeable battery 530. In order to preserve the power stored in the rechargeable battery 530, and to give the rechargeable battery 530 an opportunity to recharge, some embodiments optimize the amount of time that the head unit processing function and the electronic display are operating in an active mode. In other words, it may be advantageous in some embodiments to keep the head unit processing function in a sleep mode or low power mode and to keep the electronic display in an inactive display mode as long as possible without affecting the user experience.

When the head unit processing function and the electronic display are in an inactive or sleep mode, the power consumed by the thermostat is generally less than the power provided by power stealing. Therefore, the power that is not consumed by the thermostat can be used to recharge the rechargeable battery 530. In this embodiment, the backplate processing function 508 (MSP430) can be configured to monitor the environmental sensors in a low-power mode, and then wake the head unit processing function 532 (AM3703) when needed to control the HVAC system, etc. Similarly, the backplate processing function 508 can be used to monitor sensors used to detect the closeness of a user, and wake the head unit processing system 532 and/or the electronic display when it is determined that a user intends to interface with the thermostat.

It will be understood by one having skill in the art that the various thermostat embodiments depicted and described in relation to FIGS. 1-5 are merely exemplary and not meant to be limiting. Many other hardware and/or software configurations may be used to implement a thermostat and the various functions described herein below. These embodiments should be seen as an exemplary platform in which the following embodiments can be implemented to provide an enabling disclosure. Of course, the following methods, systems, and/or software program products could also be implemented using different types of thermostats, different hardware, and/or different software.

Wake-Up Conditions for Power Management

In modern network-enabled homes, many different types of devices can be used to control various aspects of the home environment, including air temperature, humidity, fan speed, music, television, appliances, refrigerators, and/or the like. These modern control devices may include a number of connections, both wired and wireless, to other household systems. These modern control devices may include advanced processing features and advanced electronic displays to provide a user friendly yet powerful interactive experience.

Unfortunately, advanced processing and electronic displays often require a large amount of power to create a rich user experience. Therefore, modern control units may require a wired connection to a household 110 V power line, access to an electrical outlet, or batteries that may require replacement. As described above, some embodiments of a modern control unit can steal power from the appliance or system that they are configured to control. By way of example, the thermostat described above can steal power from the household HVAC system. By combining a power stealing system with a rechargeable battery, a modern control unit may be able to provide enough power for advanced processing functions and electronic displays.

Regardless of the type of power supply used, it may be desirable for a modern control unit to conserve energy whenever possible. In power stealing systems, using advanced processing functions and/or electronic displays may require more power than can be consistently supplied by a power stealing circuit. In battery-powered systems, advanced processing functions and/or electronic displays may require enough power that battery life or capacity will be adversely affected. Even modern control units that have access to a wired power connection may still benefit from power saving arrangements. Emphasis is increasingly being placed on energy conservation, green technologies, and more efficient use of natural resources. Additionally, modern control units that conserve energy may provide significant cost savings throughout their lifetime.

Presented herein are methods and systems that can be implemented by modern control units to conserve power by intelligently operating a processing system in both a low-power mode and a high-power mode. The processing system can predictably generate a set of wake-up conditions that may require more power to handle when they occur. These wake-up conditions can be stored in a memory, and the processing system can transition into the low-power mode. The processing system may monitor environmental sensors and determine when one or more of the wake-up conditions are met. At this point, the processing system can transition back into the high-power mode to address the conditions that caused the wake-up event to occur.

As various methods and systems for generating, storing, and using wake-up conditions to transition between a low-power mode and a high-power mode are presented, it will be understood that the ensuing discussion can apply to any control unit as described above. However, throughout the remainder of this disclosure a specific type of implementation will be used, namely a thermostat. It will be understood that the principles described using thermostat hardware and software can be easily applied to other control units by one having skill in the art in light of this disclosure.

Figure 6:
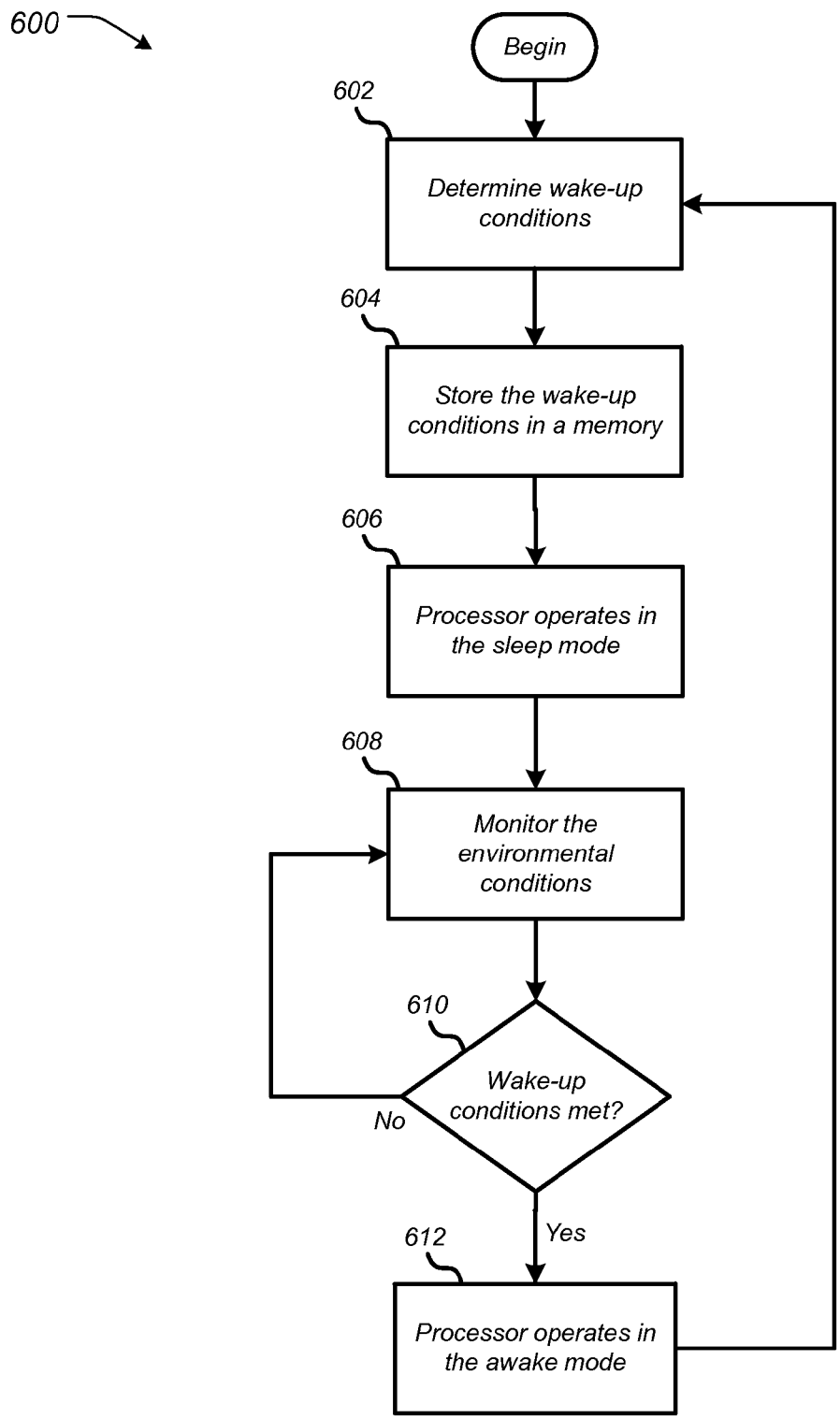
FIG. 6 illustrates a flowchart of a method for conserving power in a control unit using wake-up conditions, according to one embodiment.

FIG. 6 illustrates a flowchart 600 of a method for conserving power in a control unit using wake-up conditions, according to one embodiment. In one particular embodiment, this method may be implemented using a particular type of thermostat described elsewhere herein. By way of example, this thermostat may include a housing, a user interface, a memory disposed within the housing, and a processing system disposed within the housing. In one embodiment, the processing system may be coupled to one or more sensing systems configured to sense at least one environmental condition. The sensing system may include a temperature sensor configured to sense an ambient temperature associated with the thermostat.

Additionally, the processing system may communicate with one or more input devices, including the user interface for determining a setpoint temperature. A setpoint temperature may be a target temperature that the thermostat can use the HVAC system to achieve in the surrounding enclosure. Specifically, the processing system may communicate with an HVAC system through one or more HVAC wire connectors by comparing a measured ambient temperature and the setpoint temperature and adjusting the HVAC system output accordingly.

In one embodiment, the processing system may include at least one processor. This processor may be configured to operate in at least two modes. A first mode of operation may be characterized by the processor operating in what may be termed a sleep state, or sleep mode. When operating in the sleep state, the processor may consume a relatively low amount of power compared to when it operates in a second mode of operation. The second mode of operation may be characterized by the processor operating in what may be termed a wake state, or wake mode. The wake mode of operation may consume a relatively high amount of power compared to when the processor operates in the sleep state.

In one embodiment, the thermostat may also include a power stealing circuit to provide an amount of instantaneous power referred to as a first instantaneous power. Such a power stealing circuit may be combined with a rechargeable battery. By way of example, when the processing system is operating in the second mode of operation where the processor is in the wake state, the processing system may consume an average power that is greater than the first instantaneous power provided by the power stealing circuit. In this case, the rechargeable battery may provide the difference between the average power consumed by the processing system and the first instantaneous power provided by the power stealing circuit. For example, the processing system may use more than 100 mW of average power when the processor is operating in the wake state compared to less than 10 mW of power when the processor is operating in the sleep state. The power stealing circuit may therefore provide somewhere between 10 mW and 100 mW of instantaneous power at any given time.

Turning back to FIG. 6, the method may include determining a set of wake-up conditions (602). The set of wake-up conditions may define circumstances where the processor is to enter into the wake state from the sleep state. Therefore, the set of wake-up conditions may include environmental conditions that are of the same type that are measured by the environmental sensing system of the thermostat. For example, the set of wake-up conditions may include upper and/or lower temperature thresholds. The processing system can be configured to continue sensing environmental conditions using its sensing systems while the processing system operates in the first mode where the processor is in the sleep state. Therefore, wake-up conditions including temperature thresholds can represent temperatures that when sensed may require higher-power processing from the processing system, which may wake the processor in response.

The method may also include causing the set of wake-up conditions to be stored in a memory (604). In one embodiment, the thermostat may include one or more memories. A memory may be a part of the processing system and implemented using a discrete memory chip such as an EEPROM, a flash memory, or any other type of volatile or nonvolatile memory. A memory may also be integrated with the processor, such as an onboard RAM, cash, or other type of data memory. A memory may also be integrated with another processor in the processing system, such as an onboard memory on a microcontroller.

Regardless of the specific implementation of the memory, the processing system may cause the wake-up conditions to be stored in the memory. For example, the processor may send the wake-up conditions to a memory chip, the processor may send the wake-up conditions to a microcontroller for them to be stored thereon, or the processor may store the wake-up conditions in an internal memory, depending on the particular embodiment.

The method may further include operating the processing system in the first mode of operation where the processor is in the sleep state (606). The processor may enter the sleep state during a time interval that is subsequent to the previous step where the processing system caused the set of wake-up conditions to be stored in the memory. In other words, the processing system can store wake-up conditions and then go to sleep. In one embodiment, the processor may immediately enter the sleep state after the wake-up conditions are stored. In another embodiment, the processor may first finish a set of processing tasks, and thus a short delay may occur between the time when the wake-up conditions are stored and when the processor enters the sleep state. Other embodiments may limit the number and/or type of processing tasks to ensure that the wake-up conditions have not been rendered "stale" by the intervening processing tasks.

Note that when the processor enters the sleep state and the processing system is said to operate in the first mode, other portions of the processing system may remain active. In one embodiment, the portion of the processing system that remains active does not change the inputs that were used to generate the wake-up conditions, expect time and the surrounding environmental conditions. While the processor is asleep, other portions of the processing system may use considerably less power, and thus the overall power consumption of the processing system may still be dramatically reduced. For example, an interface with the sensing systems may remain active to measure environmental conditions while the processor is in the sleep state. Therefore, the method may also include monitoring environmental conditions (608). For example, the sensing systems of the thermostat (or other control unit) may sense temperature, humidity, barometric pressure, hazard conditions (such as smoke or fire detection), chemical levels (such as carbon monoxide), occupancy levels, noise levels, and/or the like. Each of these types of environmental conditions may also therefore be embodied in one or more of the wake-up conditions. For example, a wake-up condition may be an occupancy threshold detected by a PIR sensor. A wake-up condition may also include a humidity threshold, or any detection of a hazard conditions such as smoke. In an exemplary embodiment, the wake-up conditions include at least one temperature threshold.

The method may further include determining whether at least one of the set of wake-up conditions has been met (610). A condition may be met when a threshold is violated, e.g. when a measured temperature level meets or exceeds the threshold. For example, a measured temperature may be greater than or equal to an upper temperature threshold, or a measured temperature may be less than or equal to a lower temperature threshold. In one embodiment, meeting a single wake-up condition may cause the processor to operate in the wake mode. In another embodiment, a majority of the wake-up conditions may be required to be met to cause the processor to operate in the wake mode. In yet another embodiment, all of the wake-up conditions may be required to be met to cause the processor to operate in the wake mode.

In embodiments where a only single wake-up condition is required to be met, the processing system may thereafter operate in the second mode where the processor is in the wake state (612). This transition may occur immediately following the determination that at least one of the wake-up conditions has been met. Alternatively, the wake-up transition may be scheduled for a predetermined time period following the determination that at least one of the wake-up conditions has been met. On the other hand, if it is determined that one or more of the wake-up conditions has not been met, the processing system may continue to monitor the environmental conditions until one or more of the wake-up conditions are met (608).

It should be appreciated that the specific steps illustrated in FIG. 6 provide particular methods of using wake-up conditions to operate a control unit according to various embodiments of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Additionally, the specific steps illustrated in FIG. 6 may be implemented in various ways. The remainder of this disclosure includes enabling hardware and/or software arrangements that can be used to generate wake-up conditions, configure the processing system to operate in the various modes, determine whether wake-up conditions are met, and/or the like. It will be understood in light of this disclosure that any of the architectures, implementations, hardware, and/or software discussed below can be integrated into the method described in relation to FIG. 6 without limitation.

Figure 7:
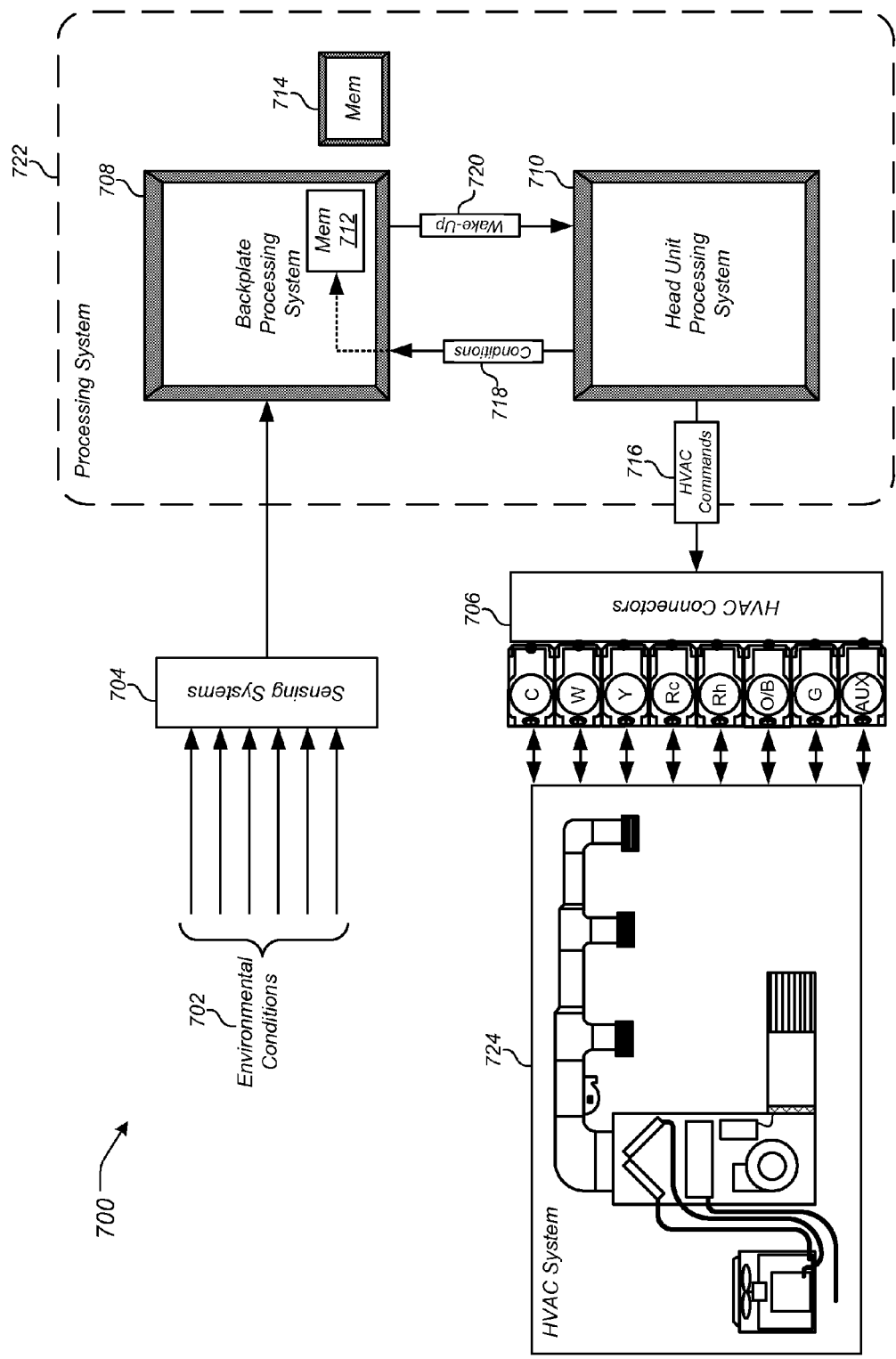
FIG. 7 illustrates a block diagram of a control unit using two processors to control an HVAC system, according to one embodiment.

FIG. 7 illustrates a block diagram 700 of a control unit using two processors to control an HVAC system, according to one embodiment. Included in this figure are various subsystems of an exemplary thermostat that may be used to interact with an HVAC system 724 to control the environment of an enclosure. This particular embodiment may include (among other things not explicitly shown) a sensing system 704 configured to detect environmental conditions 702, and a plurality of HVAC wire connectors 706 that are used to accept mechanical connections from HVAC control wires of the HVAC system 724. The sensing systems 704 and the HVAC wire connectors 706 may interface with the processing system 722.

Specific to this particular embodiment, the processing system 722 may include both a first and a second processor. The first processor (which is also referred to as simply the "processor" in the method of FIG. 6) may include a head unit processing system 710. In the arrangement of the thermostat shown in FIGS. 2-4, the head unit of the thermostat may include a processing system that performs higher power processing functions, such as control of the HVAC system and the electronic display of the user interface. In one embodiment, the head unit processing system 710 may comprise an ARM processor such as the commercially available AM3703. Similarly, the backplate of the exemplary thermostat may include a search/replace backplate processing system 708. In one embodiment, the backplate processing system 708 may comprise a microcontroller, such as the commercially available MSP430. Generally, other types and configurations of processors and microcontrollers may be used, including digital and analog circuits, lookup tables, and/or the like.

In the general description given above, the backplate processing system 708 may be included in the processing system 722 as described. In other words, while the head unit processing system 710 operates in the sleep state, the backplate processing system 708 may continue to actively interface with the sensing system 704 to monitor the environmental conditions 702. Specifically, the head unit processing system 710 may generate a set of wake-up conditions 718, cause the set of wake-up conditions 718 to be stored in a memory, and then proceed to operate in the sleep state. The backplate processing system 708 may be configured to continually monitor the sensing systems 704, determine when one or more of the wake-up conditions 718 are met, and cause the head unit processing system 710 to wake up in response by sending a wake-up signal 720 to the head unit processing system. In another embodiment (not shown) the steps in the method of FIG. 6 may be assigned to different parts of the processing system 722. For example, the set of wake-up conditions may be determined or generated by the backplate processing system 708 which may also cause the wake-up conditions to be stored in a memory.

In this embodiment, temperature control functions, such as determining time-to-temperature statistics, calculating a setpoint, learning a user's behavior, and generally operating the HVAC system, may require more processing power or code space than can be provided by the backplate processing system 708. Therefore the head unit processing system 710 may provide HVAC commands 716 to the HVAC system 724. In one embodiment, the HVAC commands 716 may be provided to the HVAC system 724 by way of the backplate processing system 708. In other words, the head unit processing system 710 can calculate and prepare the HVAC commands 716 which are then passed to the backplate processing system 708. The backplate processing system can then interface with one or more power FETs to control the connections made by the HVAC connectors 706. Because the head unit processing system 710 still generates the HVAC commands 716, the head unit processing system 710 is still controlling the HVAC system 724, even though it does so via the backplate processing system 708.

The wake-up conditions 718 can be transmitted and stored in a memory 712 that is a physically integrated part of the backplate processing system 708. Alternatively, the wake-up conditions 718 can be stored in an off chip memory 714 that is a part of the processing system 722, yet separate from both the backplate processing system 708 and the head unit processing system 710. In this case, the head unit processing system 710 may provide the wake-up conditions 718 directly to the off chip memory 714 without involving the backplate processing system 708.

It will be understood in light of this disclosure that other hardware and/or software arrangements may be used to implement the processing system described herein. Although particular advantages may be provided by the implementation illustrated by FIG. 7, one having skill in the art could make numerous design changes to this implementation that may be considered additional embodiments that are not specifically disclosed herein for brevity.

A number of different methods may be used to generate the set of wake-up conditions used by various embodiments. Generally, control logic may be used to generate HVAC commands based on software state, time, and/or environmental inputs. In one embodiment, a copy of the control logic may be used to generate the set of wake-up conditions. The copy of the control logic may be maintained in parallel with the original control logic such that the code for each is nearly identical. However, this embodiment requires a significant amount of maintenance to be duplicated on each code set.

Figure 8:
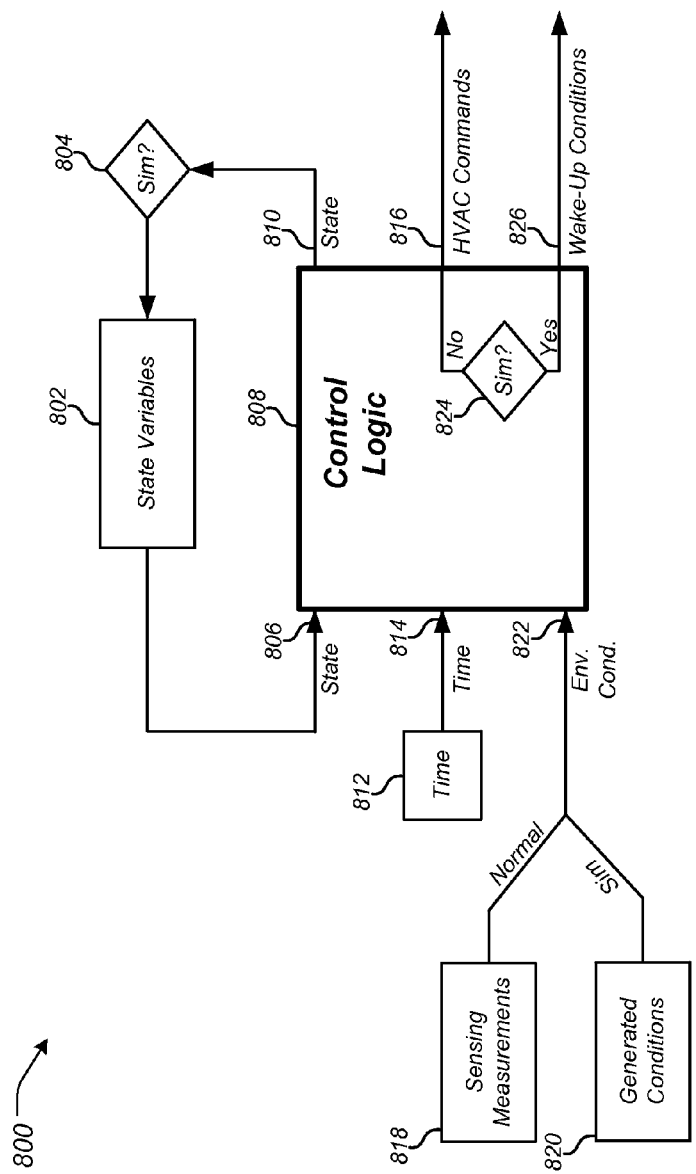
FIG. 8 illustrates a control logic module with a simulation state to generate wake-up conditions, according to one embodiment.

FIG. 8 illustrates a block diagram 800 of a control logic module 808 with a simulation state to generate wake-up conditions, according to one embodiment. In this embodiment, only a single control logic module 808 needs to be maintained in the software/hardware. The control logic module 808 can be configured to operate in a normal mode and a simulation mode. During either mode of operation, the control logic module 808 can accept an input of state variables 806 that includes operating modes (auto-away, temperature drift, preconditioning, etc.), a time 814, and one or more environmental conditions 822. The control logic module 808 can then generate a new set of state variable outputs 810 and either a set of HVAC commands 816 or a set of wake-up conditions 826.

During the normal mode of operation, the state variables may be obtained from a state variable data store 802 that may be implemented using any form of memory hardware. A current time may be used that is generated by a time module 812 that may be implemented with a real-time clock or any form of counter. Finally, the one or more environmental conditions 822 may be provided by the one or more sensing systems in the form of sensing measurements 818 obtained from the surrounding environment. The control logic module 808 can include a flag or other such setting for determining whether it is operating in the normal mode or in the simulation mode (824). When operating in the normal mode, the control logic module 808 will generate a set of HVAC commands 816 and a new set of state variables 810. Again, a decision may be made whether operating in the normal mode of the simulation mode (804). If operating in the normal mode, the newly generated state variables 810 may be stored in the state variable data store 802. The HVAC commands 816 can then be used to control the HVAC system.

In order to generate the set of wake-up conditions 826, an indicator may be set such that the control logic module 808 operates in a simulation mode. During a simulation mode of operation, the state variable input 806 may continue to be acquired from the state variable data store 802. The time input 814 may use either the current time, or a future time generated by the time module 812. The environmental condition input 822 may include one or more generated conditions from a condition generation module 820. At the output, the control logic module 808 can generate the wake-up conditions 826 instead of or in addition to the HVAC commands 816. Additionally, the newly generated state variable outputs 810 need not be stored in the state variable data store 802, and would thus not disturb the actual state or operation of the thermostat.

The condition generation module 820 may be configured to generate a set of "critical conditions" that might cause the control logic module 808 to generate a set of HVAC commands 816 that would alter the operation of the HVAC system. In other words, the critical conditions may be a set of environmental measurements that could require the control logic module 808 to change its output HVAC commands. In the case of a thermostat, the set of critical conditions may comprise a set of critical temperatures. The critical temperatures may include a setpoint temperature, a hysteresis band around a setpoint temperature, high and low temperatures selected to prevent damage to the thermostat or the enclosure, for example to prevent pipes from freezing and/or the like. Each of these critical temperatures may be sequentially submitted as an environmental condition input 822 to the control logic module 808. If it is determined that the control logic module 808 would cause the HVAC system to operate differently based on a particular critical temperature, that temperature may be added to the set of wake-up conditions 826.

In one embodiment, the set of wake-up conditions includes an upper threshold temperature and a lower threshold temperature. In this case, even if multiple critical temperatures would cause a change in the HVAC system commands, only two temperatures are selected as wake-up conditions, namely the upper and lower temperatures that are closest to the current temperature. For example, at a current temperature of 75°, two critical temperatures could be submitted to the control logic module 808 including a lower setpoint temperature of 70°, and a lower safety temperature of 45°. Even though both of these temperatures would cause the HVAC system to operate differently, only the lower setpoint temperature of 70° would be designated as a wake-up condition because the thermostat would have to react to the 70° temperature far before it would ever get to the 45° temperature. (Note that the temperatures herein are expressed in Farenheit merely for convenience.)

As will be described further below, the time input 814 can also be modified to generate a time-wise profile of temperature values, which, if met or exceeded, would cause the processor to operate in the wake mode and control the HVAC system. For example, one set of wake-up conditions could be generated for the current time, and another set of wake-up conditions could be generated for a time two hours in the future. This can generate a vector of thresholds that change over time. In one embodiment, the set of wake-up conditions can include pairs of (i) time values and (ii) environmental condition thresholds. Each pair can include one time value and one set of environmental condition thresholds. This feature may be particularly advantageous for preconditioning operations.

Figure 9:
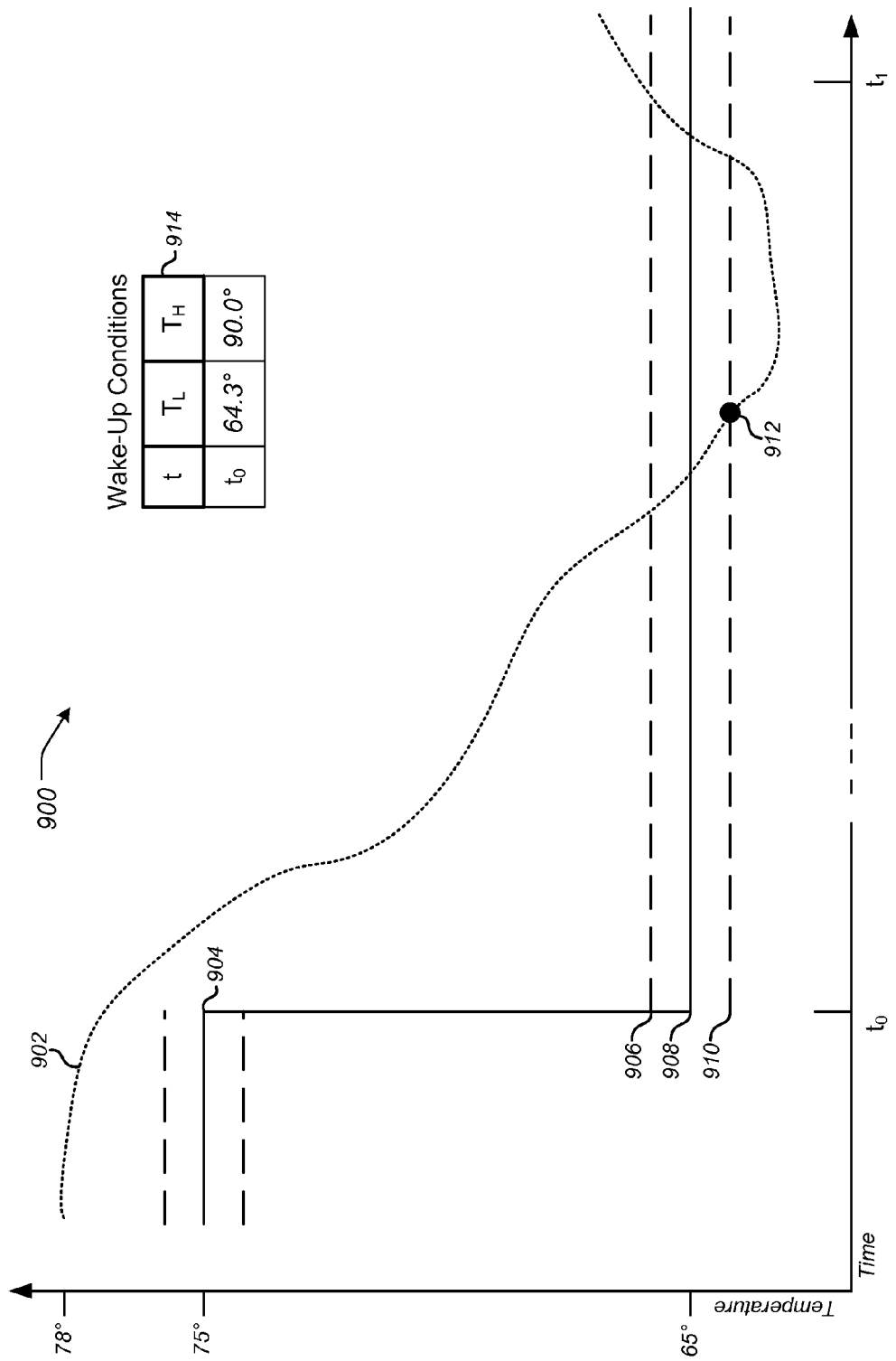
FIG. 9 illustrates a graph of a threshold used as a wake-up condition, according to one embodiment.

FIG. 9 illustrates a graph 900 of a threshold used as a wake-up condition, according to one embodiment. This simplified example includes only a single pair of time values and environmental condition thresholds 914. In other words, the processor may be put to sleep while the processing system continues to monitor the temperature to determine whether it falls below 64.3° or climbs above 90.0°, at which point the processor would wake to operate the HVAC system. In this embodiment, the thermostat may be operating in a heating mode. Prior to time $t_0$, the thermostat may be set to a setpoint 904 of 75°. At time $t_0$, which may correspond to a user's bedtime, the thermostat may be set to a setpoint 908 of 65°.

Notice that a hysteresis band surrounds setpoint 908 and setpoint 904. In one embodiment, the thermostat will start heating once the temperature falls below lower bound 910 and stop heating after the temperature climbs above upper band 906. In some embodiments, setpoint 908, lower band 910, and upper band 906 could all be submitted to the control logic module in simulation mode as critical temperatures. In this case, it is probable that the lower band 910 would be selected as a wake-up condition representing a lower threshold temperature.

At time $t_0$, the processing system could cause the wake-up conditions 914 to be stored in a memory, and in the processor could then operate in the sleep mode for a time going forward. If the ambient temperature 902 gradually drifts down during the night, it may eventually cross the lower lower temperature threshold of 64.3°. At this point 912, one or more of the wake-up conditions 914 could be determined to have been met by the measured ambient temperature, and the processor could transition from the sleep state to the wake state. The processor could then operate the HVAC system, preferably to heat the enclosure above the upper band 906. After starting to heat the enclosure, the processing system could again cause a new set of wake-up conditions to be stored in a memory, and the processor could operate in the sleep mode until one or more of the new set of wake-up conditions were met.

Figure 10A:
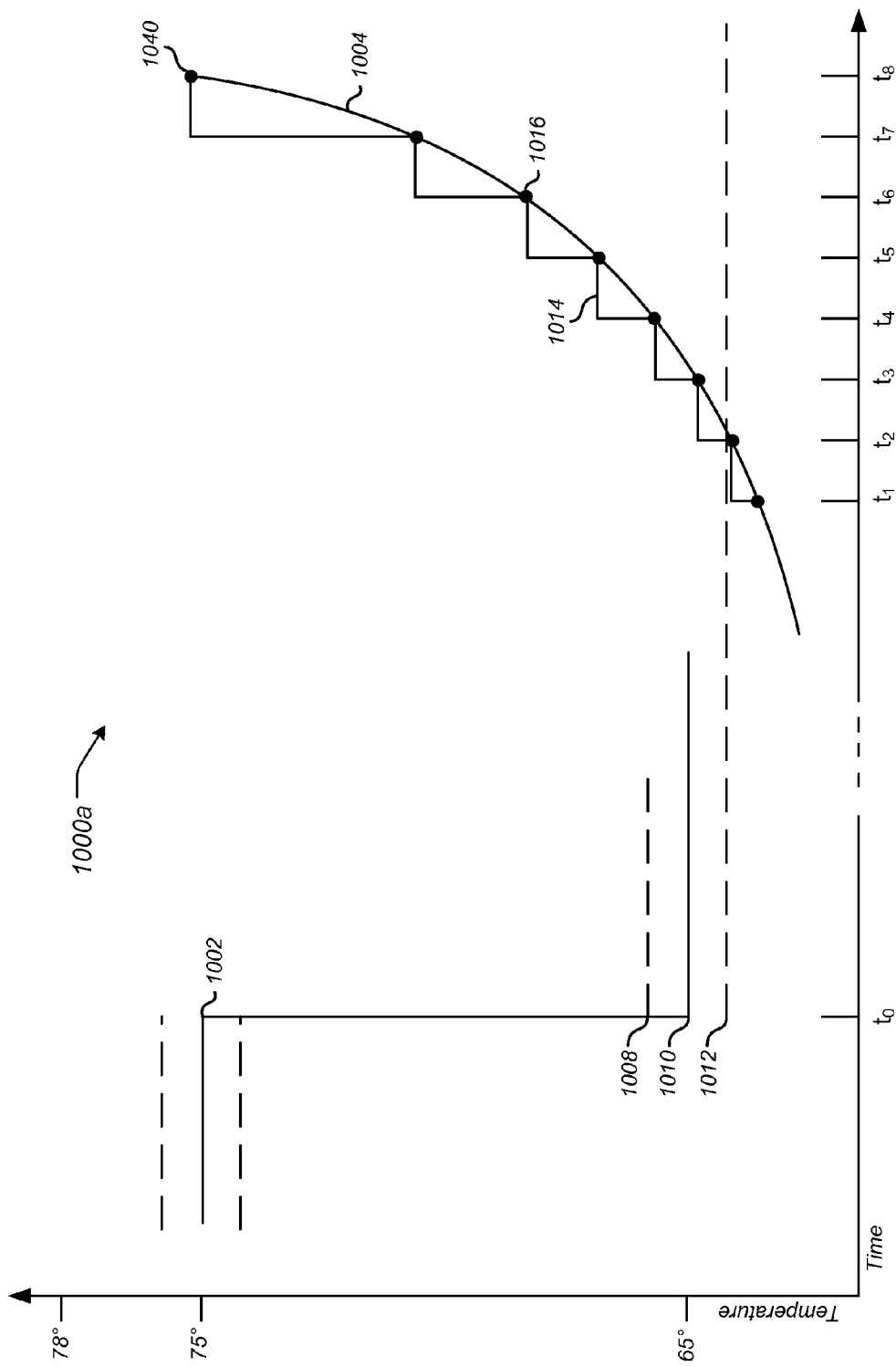
FIG. 10A illustrates a graph of thresholds generated for preconditioning, according to one embodiment.

FIG. 10A illustrates a graph 1000a of thresholds generated for preconditioning, according to one embodiment. Note that this graph is similar to graph 900 of FIG. 9, except that a preconditioning curve 1004 is also included. Preconditioning can refer to a function where a setpoint temperature is scheduled for a future time. For example, the user may set a temperature setpoint at 65° overnight, but then schedule a setpoint of 75° for the morning to again heat the house. In order to heat the house to 75° by time $t_8$, the HVAC system must turn on at some point prior to time $t_8$. A set of preconditioning criteria information (PCI) may be statistically generated over time by the thermostat to calculate how long before time $t_8$ the HVAC system would need to begin heating in order to reach 75° at time $t_8$. The PCI may be based on an evaluation of a setpoint target temperature and an amount of time relative to a target time that it will take to reach the setpoint target temperature from a given ambient temperature. The PCI can be considered representative of conditions under which a preconditioning operation should be performed.

Turning back to FIG. 10, preconditioning curve 1004 represents when the HVAC system would need to begin heating in order to reach the target temperature by the target time. For example, if the ambient temperature crossed the preconditioning curve 1004 at point 1016, the HVAC system would need to begin heating at time $t_6$ in order to reach 75° at time $t_8$.

In order to generate a set of wake-up conditions based on a preconditioning curve, the preconditioning curve can be quantized into a set of discrete time intervals during which temperature threshold(s) may be established. For example, the regular intervals shown in FIG. 10 may correspond to five-minute time intervals, 10 minute time intervals, 20 minute time intervals, etc. Using the preconditioning curve values at each time period, a step function may be generated of lower temperature thresholds for each time. Therefore, if the ambient temperature crosses one of the temperature thresholds in this step function, processor can transition from the sleep state to the wake state and begin operating the HVAC system. It will be understood that the same operations can be accomplished for thermostats in a cooling mode using upper temperature thresholds, along with other types of environmental operations, such as humidifiers, dehumidifiers, and/or the like.

Figure 10B:
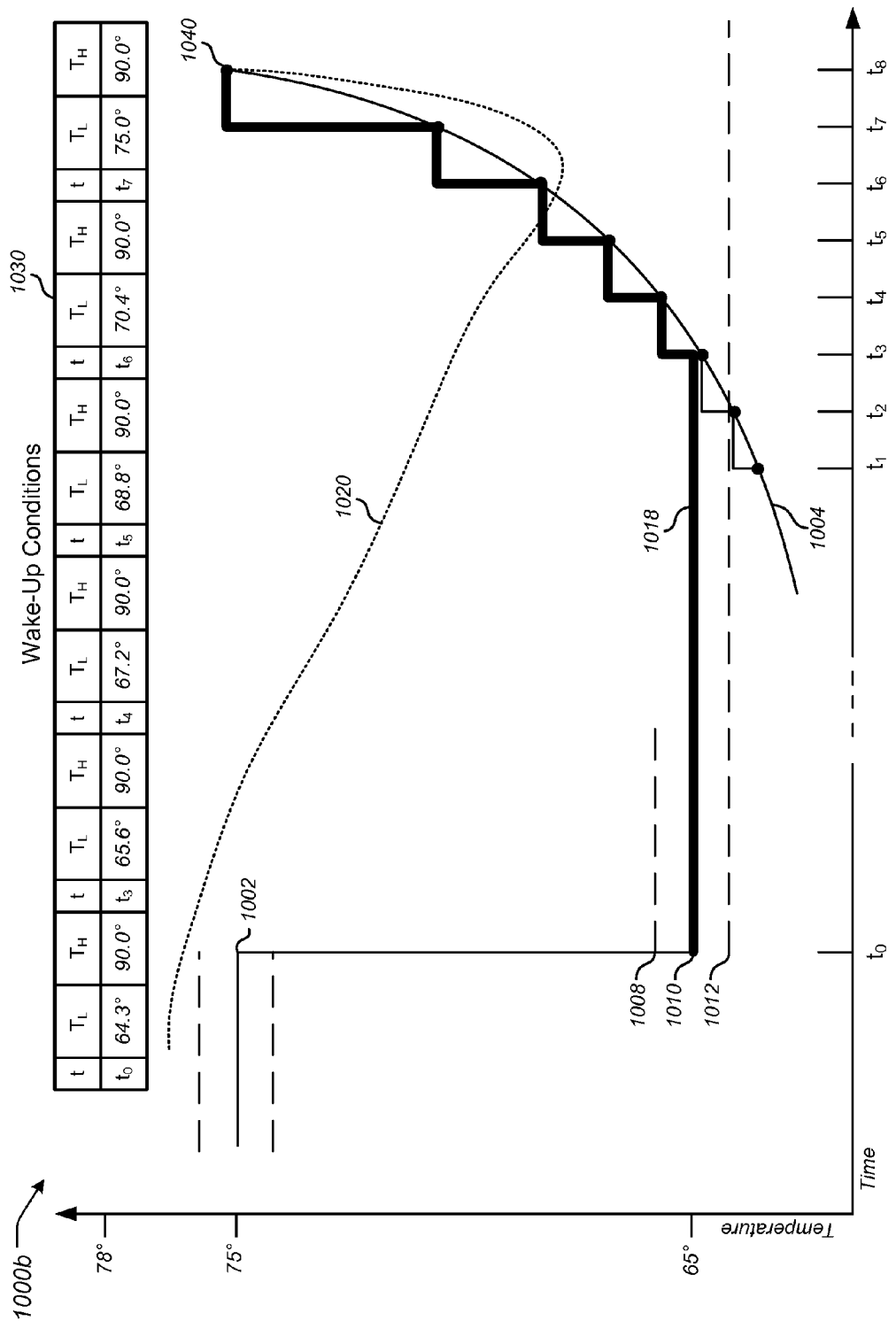
FIG. 10B illustrates a graph of wake-up conditions for a preconditioning operation, according to one embodiment.

FIG. 10B illustrates a graph 1000b of wake-up conditions for a preconditioning operation, according to one embodiment. Graph 1000b is based on graph 1000a from FIG. 10A. In this case, the wake-up conditions 1030 include a time-series of threshold values to be evaluated during each discrete time interval. In this example, a user may set an overnight setpoint 1010 of 65°. The overnight setpoint 1010 can be used as a lower threshold in the wake-up conditions until it intersects with the step function generated by the preconditioning curve. (Note that in this case, the upper band 1008 and/or the lower band 1012 of the hysteresis band are not used as the setpoint; however, in many embodiments either one of these bands could be used as the lower temperature threshold).

When the overnight setpoint 1010 intersects with the step function generated by the hysteresis curve, a new time/threshold pair can be added to the wake-up conditions 1030. From that point, each step in the step function can add a subsequent time/threshold pair to the wake-up conditions 1030 until the morning setpoint 1040 is reached. Therefore, if the ambient temperature 1020 at any time intersects with the step function 1018 associated with the temperature thresholds, the processor may transition from the sleep state to the wake state and operate the HVAC system to begin heating the enclosure, as shown by the ambient temperature 1020 curve illustrated in FIG. 10B.

In the previous examples, only a single overnight schedule of wake-up conditions has been provided. However, it will be understood that this schedule of wake-up conditions can be extended over many days or weeks, or even in perpetuity until the processor of the processing system is required to operate in the wake state. In some cases, a time limit may be sent as a part of the wake-up conditions. The time limit may represent the maximum amount time that the processing system should operate in the first mode where the processor is in the sleep state.

In some embodiments, other wake-up conditions may also be included that are not specifically related to environmental conditions. For example, the thermostat may include a Wi-Fi chip that wakes the processor upon receiving a wireless transmission. The processor may also be connected via a serial communication line to another part of the processing system that will wake up the processor when a transmission is detected. The user interface may also send signals to the processor that indicate that a user is interacting with the thermostat to wake the processor. In another embodiment, a power management circuit may wake the processor to deal with critical power management events. Additionally, other parts of the processing system may wake the processor based on critical failures. For example, a backplate processor may wake a head unit processor if the backplate processor begins to fail. In this case, the head unit processor may reset the backplate processor so that the operation of the thermostat is not significantly interrupted. Each of these other means for waking up the processor may be accomplished using various hardware and/or software mechanisms, including a set of dedicated pins that generate an interrupt configured to wake the processor.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

What is claimed is:

1. A thermostat, comprising:
   a housing and a user interface coupled to said housing;
   a memory disposed within the housing;
   one or more sensing systems configured to sense at least one environmental condition;
   a processing system disposed within the housing and coupled to said user interface, the processing system being configured to be in operative communication with the one or more sensing systems, in operative communication with one or more input devices including said user interface for determining a setpoint temperature value, and in still further operative communication with a heating, ventilation, and air conditioning (HVAC) system to control the HVAC system based at least in part on a comparison of a measured ambient temperature and the setpoint temperature value, the processing system including a processor coupled to said memory, the processor having a relatively low power-consuming sleep state and a relatively high power-consuming wake state, wherein the processing system operates by:
      determining a set of wake-up conditions upon which said processor is to enter into said wake state from said sleep state, said set of wake-up conditions including at least one threshold value associated with at least one of the environmental conditions sensed by said at least one sensing system;
      causing the set of wake-up conditions to be stored in said memory;
      operating in a first mode in which said processor is in said sleep state during a time interval subsequent to said causing the set of wake-up conditions to be stored in said memory;
      determining, while said processor is in said sleep state, whether at least one of the set of wake-up conditions including said at least one threshold value has been met; and
      operating in a second mode in which said processor is in said wake state upon a determination that the at least one of the set of wake-up conditions has been met, the processing system being configured to control the HVAC system while operating in the second operating mode.

2. The method of claim 1 wherein the processor comprises a first processor, and wherein the processing system comprises:
   a second processor that performs said determining whether at least one of the set of wake-up conditions has been met.

3. The method of claim 2 wherein said memory is physically integrated with said second processor.

4. The method of claim 2 wherein said processing system uses more than 100 mW of average power when said first processor is operating in the second mode, and wherein said processing system uses less than 10 mW when said first processor is operating in the first mode, and wherein said second processor uses less than 10 mW of instantaneous power.

5. The method of claim 1 wherein said at least one environmental condition comprises a temperature value.

6. The method of claim 1 wherein said set of wake-up conditions comprises a time-wise profile of temperature values, which if met or exceeded, causes said processor to operate in the second mode in which said processor is in said wake state.

7. The method of claim 1 wherein said wake-up conditions are selected from the group consisting of: detected occupancy, a detected hazard condition, a humidity threshold and a noise threshold.

8. The method of claim 1 wherein said set of wake-up conditions comprises pairs of (i) time values, and (ii) environmental condition thresholds.

9. The method of claim 1 wherein said set of wake-up conditions is generated based on a preconditioning criteria information (PCI), said PCI being based on an evaluation of a setpoint target temperature and an amount of time relative to a target time, said PCI being representative of conditions under which a preconditioning operation should be performed.

10. The method of claim 1 wherein said set of wake-up conditions is generated using an output from an HVAC control module, said HVAC control module being configured to generate HVAC control signals based on a set of state variables, a current time, and current environmental conditions.

11. The method of claim 10 wherein said HVAC control module is configured to operate in a simulation mode wherein said set of wake-up conditions is generated without affecting said set of state variables or said HVAC system.

12. The method of claim 11 wherein said processing system generates a set of critical environmental conditions, wherein each of said set of critical environmental conditions is provided as an input to said HVAC control module, wherein each of said set of wake-up conditions is based on an output from said HVAC control module operating in said simulation mode using at least one of said set of critical environmental conditions as an input.

13. The method of claim 1 said set of weight-of conditions comprises a safety temperature selected to prevent damage to the HVAC system or an enclosure in which the thermostat is installed.

14. The method of claim 1 further comprising:
a power-stealing circuit providing a first instantaneous power; and
a rechargeable battery, wherein when said processing system is operating in the second mode in which said processor is in said wake state, said processing system consumes an average power that is greater than said first instantaneous power, wherein a difference between said average power and said first instantaneous power is provided by said rechargeable battery.

15. A method of reducing an amount of power used by a thermostat, the thermostat including a housing and a user interface coupled to the housing, the method comprising:
providing power to a processing system disposed within said housing and coupled to said user interface, the processing system being configured to be in operative communication with one or more sensing systems configured to sense at least one environmental condition, in operative communication with one or more input devices including said user interface for determining a setpoint temperature value, and in still further operative communication with a heating, ventilation, and air conditioning (HVAC) system to control the HVAC system based at least in part on a comparison of a measured ambient temperature and the setpoint temperature value, the processing system including a processor coupled to a memory, the processor having a relatively low power-consuming sleep state and a relatively high power-consuming wake state;
determining a set of wake-up conditions upon which said processor is to enter into said wake state from said sleep state, said set of wake-up conditions including at least one threshold value associated with at least one of the environmental conditions sensed by said at least one sensing system;
causing the set of wake-up conditions to be stored in said memory;
operating in a first mode in which said processor is in said sleep state during a time interval subsequent to said causing the set of wake-up conditions to be stored in said memory;
determining, while said processor is in said sleep state, whether at least one of the set of wake-up conditions including said at least one threshold value has been met; and
operating in a second mode in which said processor is in said wake state upon a determination that the at least one of the set of wake-up conditions has been met, the processing system being configured to control the HVAC system while operating in the second operating mode.

16. The method of claim 15 wherein the processor comprises a first processor, and wherein the processing system comprises:
a second processor that performs said determining whether at least one of the set of wake-up conditions has been met.

17. The method of claim 15 wherein said set of wake-up conditions comprises a time-wise profile of temperature values, which if met or exceeded, causes said processor to operate in the second mode in which said processor is in said wake state.

18. The method of claim 15 wherein said set of wake-up conditions is generated using an output from an HVAC control module, said HVAC control module being configured to generate HVAC control signals based on a set of state variables, a current time, and current environmental conditions.

19. The method of claim 18 wherein said HVAC control module is configured to operate in a simulation mode wherein said set of wake-up conditions is generated without affecting said set of state variables or said HVAC system.

20. A thermostat comprising:
a housing comprising a user interface;
a memory disposed within the housing;
a temperature sensor disposed within the housing and configured to sense an ambient temperature;
a processing system disposed within the housing, wherein the processing system comprises a first processor and a second processor, wherein:
the first processor is configured to:
determine a wake-up temperature threshold for determining when the first processor should transition from a low-power state to a high-power state;
send the wake-up temperature threshold to the second processor; and
transition from the high-power state to the low-power state after the wake-up temperature threshold is sent to the second processor; and
the second processor is configured to:
receive a measurement of the ambient temperature from the temperature sensor;
determine whether the ambient temperature violates the wake-up temperature threshold; and
cause the first processor to transition from the low-power state to the high-power state if the ambient temperature violates the wake-up temperature threshold.

* * * * *